(12) United States Patent
Shibata

(10) Patent No.: US 7,302,380 B2
(45) Date of Patent: Nov. 27, 2007

(54) SIMULATION APPARATUS, METHOD AND PROGRAM

(75) Inventor: Kohsaku Shibata, Takatsuki (JP)

(73) Assignee: Matsushita Electric, Industrial Co., Ltd., Osaka (JP)

( * ) Notice: Subject to any disclaimer, the term of this patent is extended or adjusted under 35 U.S.C. 154(b) by 583 days.

(21) Appl. No.: 10/730,120

(22) Filed: Dec. 9, 2003

(65) Prior Publication Data

US 2004/0117172 A1    Jun. 17, 2004

(30) Foreign Application Priority Data

Dec. 12, 2002    (JP)    ............................. 2002-360362

(51) Int. Cl.
 *G06F 9/45*    (2006.01)
(52) U.S. Cl. .................. 703/22; 716/1; 716/4; 716/10; 712/218; 712/239; 712/225
(58) Field of Classification Search .................. 703/22; 716/1, 4, 10; 710/261; 714/33; 712/218, 712/239, 225; 717/141; 713/400; 711/207
See application file for complete search history.

(56) References Cited

U.S. PATENT DOCUMENTS

| | | | |
|---|---|---|---|
| 6,199,152 B1* | 3/2001 | Kelly et al. ................. | 711/207 |
| 6,397,324 B1* | 5/2002 | Barry et al. ................. | 712/225 |
| 6,681,280 B1* | 1/2004 | Miyake et al. .............. | 710/261 |
| 6,826,522 B1* | 11/2004 | Moller et al. ................. | 703/22 |
| 6,871,298 B1* | 3/2005 | Cavanaugh et al. .......... | 714/33 |
| 7,051,309 B1* | 5/2006 | Crosetto ...................... | 716/10 |
| 2001/0025363 A1* | 9/2001 | Ussery et al. ................. | 716/1 |
| 2002/0124155 A1* | 9/2002 | Sami et al. .................. | 712/218 |
| 2002/0133784 A1* | 9/2002 | Gupta et al. ................... | 716/1 |
| 2003/0188299 A1* | 10/2003 | Broughton et al. ......... | 717/141 |
| 2003/0204819 A1* | 10/2003 | Matsumoto et al. ........... | 716/1 |
| 2004/0025073 A1* | 2/2004 | Soufi et al. ................. | 713/400 |
| 2004/0068701 A1* | 4/2004 | Chang et al. .................. | 716/4 |
| 2004/0078674 A1* | 4/2004 | Raimi et al. .................. | 714/33 |
| 2004/0172524 A1* | 9/2004 | Hoogerbrugge ............. | 712/239 |

FOREIGN PATENT DOCUMENTS

| | | |
|---|---|---|
| JP | 8-272612 | 10/1996 |
| JP | 11-065845 | 3/1999 |

OTHER PUBLICATIONS

Sami et al., "An instruction level engery model for embedded VLIW architectures" IEEE, Sep. 2002.*
Jee et al., "Performance evaluation for a compressed VLIW processor", ACM, Mar. 2002.*
Jouppi et al., "Avaliable instruction level parallelism for superscalar and superpipelined machines", ACM 1989.*

* cited by examiner

*Primary Examiner*—K. Thangavelu
(74) *Attorney, Agent, or Firm*—Winderoth, Lind & Ponack, L.L.P.

(57) ABSTRACT

A simulation apparatus for simulating a pipeline processor including a pipeline simulation unit and an instruction simulation unit. The simulation apparatus includes a pipeline simulation unit is operable to simulate a group of instructions comprising a plurality of instructions to be executed simultaneously. The instruction simulation unit is operable to simulate a sequential execution, of the group of instructions on an instruction-by-instruction basis, based on the simulation result performed by the pipeline simulation unit. The instruction simulation unit generates the simulation result by undoing the simulation where an instruction included in the group of instructions that has just been simulated by the pipeline simulation unit.

23 Claims, 32 Drawing Sheets

FIG. 6

| | Address | Mnemonic | Instruction execution contents | Update resource |
|---|---|---|---|---|
| Instruction group 1 | Instruction 1 | 0x8000 | sub R0,R1 | R0=R0 - R1 | R0 |
| | Instruction 2 | 0x8002 | add R2,1 | R2=R2 + 1 | R2 |
| | Instruction 3 | 0x8004 | ld R3,(R4+) | R3=mem(R4),R4=R4+4 | R3,R4 |
| Instruction group 2 | Instruction 4 | 0x8006 | st (R4+),R2 | mem(R4)=R2,R4=R4+4 | mem(R4),R4 |
| | Instruction 5 | 0x8008 | or R5,R6 | R5=R5 | R6 | R5 |

FIG. 7

| Cycle | Update resource |
|---|---|
| N+1 | R0,R2,R3,R4 |
| N+2 | <None> |
| N+3 | mem(R4),R4,R5 |

FIG. 8

| | Address | Mnemonic | Instruction execution contents |
|---|---|---|---|
| Instruction 6 | 0x9000 | cmp F0,R0,R1 | F0=1 when R0 equals to R1, F0=0 when R0 does not equal to R1 |
| Instruction 7 | 0x9002 | [F0] add R2,1 | R2=R2+1 when F0 is 1, Nothing is performed when F0 is not 1 |
| Instruction 8 | 0x9004 | add R3,1 | R3=R3+1 |

Simultaneous execution: Instruction 6, Instruction 7

FIG. 9

| | Address | Mnemonic | Instruction execution contents |
|---|---|---|---|
| Instruction 12 | 0xB000 | mov R0,1 | R0=1 |
| Instruction 13 | 0xB002 | ld R1,(R2+) | R1=mem(R2),R2=R2+4 |
| Instruction 14 | 0xB004 | mov R1,3 | R1=3 |

Simultaneous executionl

FIG. 22

| | | PC | Mnemonic | Simulation result {R0,R1,R2,R3,F0} | Display result {R0,R1,R2,R3,F0} | Stop |
|---|---|---|---|---|---|---|
| Instruction group 1 | Instruction 6 | 0x9000 | cmp F0,R0,R1 | [1,0,0,0,0] | [1,0,0,0,1] | ○ |
| | Instruction 7 | 0x9002 | [F0] add R2,1 | [1,0,0,0,0] | [1,0,0,0,0] | × |
| Instruction group 2 | Instruction 8 | 0x9004 | add R3,1 | [1,0,0,1,0] | [1,0,0,0,0] | ○ |

FIG. 23

| | | PC | Mnemonic | Display result {R0,R1,R2,R3,R4,R5,R6} | Stop |
|---|---|---|---|---|---|
| Instruction group 1 | Instruction 1 | 0x8000 | sub R0,R1 | [10,5,0,0,0,1,2] | ○ |
| | Instruction 2 | 0x8002 | add R2,1 | [5,5,0,0,0,1,2] | ○ |
| | Instruction 3 | 0x8004 | ld R3,(R4+) | [5,5,1,0,0,1,2] | |
| Instruction group 2 | Instruction 4 | 0x8006 | st (R4+),R2 | [5,5,1,100,4,1,2] | ○ |
| | Instruction 5 | 0x8008 | or R5,R6 | [5,5,1,100,8,1,2] | ○ |

FIG. 24

| | PC | Mnemonic | Display result {R0,R1,R2} | Stop |
|---|---|---|---|---|
| Instruction 12 | 0xB000 | mov R0,1 | [0,0,0] | ○ |
| Instruction 13 | 0xB002 | ld R1,(R2+) | [1,0,0] | ○ |
| Instruction 14 | 0xB004 | mov R1,3 | [1,200,4] | ○ |

Instruction group 5

| First register file [R0,R1,R2] |
|---|
| {1,3,4} |

| Second register file [R0,R1,R2] |
|---|
| {0,0,0} |

| Third register file [R0,R1,R2] |
|---|
| {1,0,0} |

| Fourth register file [R0,R1,R2] |
|---|
| {1,0,4} |

| Memory access data |
|---|
| {200} |

FIG. 25

| | | PC | Mnemonic | Simulation result {R0,R1,R2,R3,F0} | Display result {R0,R1,R2,R3,F0} | Stop |
|---|---|---|---|---|---|---|
| Instruction group 1 | Instruction 6 | 0x9000 | cmp F0, R0, R1 | [1,0,0,0,0] | [1,0,0,0,0] | ○ |
| | Instruction 7 | 0x9002 | [F0] add R2, 1 | [1,0,0,0,0] | [1,0,0,0,0] | ○ |
| Instruction group 2 | Instruction 8 | 0x9004 | add R3, 1 | [1,0,0,1,0] | [1,0,0,1,0] | ○ |

FIG. 26

```
> set stepmode, cycle
Cycle Step Mode is set as single step mode.
>
```
W3

FIG. 27

```
> set stepmode, inst
Instruction Step Mode is set as single step mode.
>
```
W3

SIMULATION APPARATUS, METHOD AND PROGRAM

BACKGROUND OF THE INVENTION (1) Field of the Invention

The present invention relates to a simulation apparatus for executing a program for a Very Long Instruction Word (VLIW) processor assisting a software developer in program development.

(2) Description of the Related Art

A simulation apparatus that simulates the simulation condition of a processor is useful in program development. A simulation apparatus for a processor that performs a pipeline control performs a pipeline simulation correctly, and thus it performs a simulation on a cycle-by-cycle basis. There is a patent literature 1 as a related art literature concerning this.

The pipeline computer simulator disclosed in this patent literature 1 performs the simulation of a step operation on an instruction-by-instruction basis while performing a pipeline simulation. By doing so, a step operation for a single instruction that is useful for a debug operation is intuitive to operate correctly.

Also, the stall detection display device disclosed in patent literature 2 detects stall that occurs in an assembler source caused by analyzing the assembler source and highlights the cause of stall occurrence on the assembler source and the part corresponding to a pipeline image which is an analysis result of the assembler source.

By doing so, a programmer recognizes the cause of stall occurrence in the pipeline.

[patent literature 1]

Japanese Laid-Open Patent application No. 8-272612

[patent literature 2]

Japanese Laid-Open Patent application No. 11-65845

However, in the above-mentioned related art, a software developer cannot confirm the simulation process performed on an instruction-by-instruction basis in detail when a simulation apparatus is intended for a processor that executes a plurality of instructions simultaneously although it can simulate a plurality of instructions simultaneously and highlights the cause of the stall occurrence.

SUMMARY OF THE INVENTION

The present invention is intended for a processor that executes a plurality of instructions simultaneously and an object of this invention is to provide a simulation apparatus that performs simulation in a way that the simulation process performed on an instruction-by-instruction basis is clear.

In order to achieve the above-mentioned object, the simulation apparatus of the present invention is intended for a very long instruction word processor. The simulation apparatus includes a first simulation unit operable to simulate execution of a group of instructions to be executed simultaneously, and a second simulation unit operable to generate a simulation result of the group of instructions on an instruction-by-instruction basis based on a simulation result generated by the first simulation unit.

This construction makes it easier to debug and verify each instruction because it uses the simulation results of a group of instructions and generates the simulation results as to each instruction in the group of instructions, and thus it brings an effect of giving a software developer the illusion that instructions are simulated on an instruction-by-instruction basis in sequential order. For example, it is possible to minutely confirm the execution processes of instructions to be executed simultaneously on an instruction-by-instruction basis.

Here, the second simulation unit may generate a simulation result by undoing a simulation of an instruction included in a group of instructions that has just been simulated by the first simulation unit.

This construction makes it possible to generate the simulation result on an instruction-by-instruction basis easily by utilizing the simulation result of a group of instructions that has just been simulated by the first simulation unit.

Also, the simulation apparatus may further include a display control unit operable to control a display unit to display the simulation result generated by the second simulation unit.

Here, the second simulation unit may include a judgment unit operable to judge whether an instruction that satisfies a break condition is included in the group of instructions that has just been simulated by the first simulation unit or not, an indication unit operable to indicate that the first simulation unit simulates execution of a next group of instructions when it is judged that no instruction satisfying the break condition is included, a determination unit operable to determine an instruction as a stop instruction when it is judged that the instruction satisfying the break condition is included, and a generation unit operable to generate a simulation result by undoing simulations of the stop instruction and the following instructions in the group of instructions that have just been simulated.

Also, the first simulation unit is intended for a pipeline processor that executes a plurality of instructions simultaneously, and the simulation apparatus may further include a display image generation unit operable to generate a display image showing instructions that are included in a pipeline based on simulation results generated by the first simulation unit and the second simulation unit.

Here, the display image may include the representation of instructions that is included in every stage of the pipeline.

This construction enables a user to debug and verify the simulation results of respective instructions on an instruction-by-instruction basis and their statuses before and after the simulation in the pipeline.

Here, the first simulation unit may simulate, on a cycle-by-cycle basis, operations of a pipeline processor that executes a plurality of instructions simultaneously, the simulation apparatus may further include an acception unit operable to accept a user operation that indicates one of a step execution performed on an instruction-by-instruction basis and a step execution performed on a cycle-by-cycle basis, and a display image generation unit operable to generate a display image that shows a simulation result generated on an instruction-by-instruction basis by the second simulation unit when a user operation that indicates a step execution performed on an instruction-by-instruction basis is accepted and to generate a display image that shows a simulation result generated on a cycle-by-cycle basis by the first simulation unit when a user operation that indicates a step execution performed on a cycle-by-cycle basis is accepted.

This construction enables a user to select simulating a group of instructions on a cycle-by-cycle basis or on an instruction-by-instruction basis randomly.

Further, the first simulation unit may include a hold unit operable to hold first data showing resources of the very long instruction word processor, a storage unit operable to store a copy of the first data in the memory unit as second data, and a first simulator that updates the first data by simulating an execution of a single group of instructions after storing the copy. The second simulation unit obtains simulation results of the group of instructions on an instruction-by-instruction basis based on the first data and the second data.

This construction makes it possible to obtain the simulation result on an instruction-by-instruction basis based on the second data that shows the resource before simulating a single group of instructions and the first data that shows the resource after simulating the group of instructions.

Also, the second simulation unit may include a judgment unit operable to judge whether an instruction that satisfies a break condition is included in the group of instructions that has just been simulated by the first simulation unit or not, an indication unit operable to indicate that the first simulation unit simulates execution of a next group of instructions when it is judged that no instruction satisfying the break condition is included, and a determination unit operable to determine an instruction that satisfies the break condition as a stop instruction when it is judged that the instruction satisfying the break condition is included.

This construction enables a software developer to easily confirm the correlation of instructions in a plurality of instructions to be executed simultaneously because it is possible to break the instructions individually as to a plurality of instructions to be executed simultaneously. Also, it is possible to break those instructions in the actual simulation path in the processor because the break conditions are judged concerning the instructions included in the simulated group of instructions. For example, instructions that are not executed are never broken erroneously when cancelled instructions are included in the group of instructions.

Here, the first simulator may simulate execution of the group of instructions on a cycle-by-cycle basis of pipeline processing, the first simulator being intended for the very long instruction word processor that executes the pipeline processing, and the simulation apparatus may further count the number of execution cycles in the simulation for every group of instructions.

This construction is intended for the VLIW processor on which a pipe line processing is performed and it makes it possible to simulate the number of pipeline cycles of a processor correctly generating the simulation results on an instruction-by-instruction basis.

Also, the first simulator may generate update information that shows the resource to be changed by the instruction concerning each instruction of the group of instructions, and the reconstruction unit may reconstruct the resource data corresponding to the simulation results of instructions up to the instruction of the group of instructions on an instruction-by-instruction basis according to the first, the second and the update information.

This construction makes it possible to reconstruct the resource data by using the update information.

Here, the first simulator may further simulate the delay cycle of the delay instruction that causes the delay cycle on the execution stage of the VLIW processor, and the reconstruction unit may generate the resource data corresponding to the simulation result of the delay instruction according to the update information on the delay instruction.

This construction makes it possible to generate the simulation results executed one-by-one in order on an instruction-by-instruction basis in simulating although the simulation order is changed, that is, the plurality of instructions are performed nonsimultaneously in the cycle level because the delay instruction in the plurality of instructions to be executed simultaneously is performed with a time lag in the processor.

Further, the reconstruction unit may generate the resource data corresponding to the simulation result of the output dependency instruction that has the output dependency in the same group of instructions between a delay instruction that causes a delay cycle in the execution stage of the VLIW processor to be simulated and an output dependency instruction that has output dependency in the same group of instructions according to the update information on the delay instruction and the update information on the output dependency instruction.

This construction enables a software developer to know the consequent cancellation process of the output dependency instruction. This is possible because the simulation result of the instructions are to be cancelled because the output dependency is generated in simulating on an instruction-by-instruction basis, although one of the execution results of instructions to be executed simultaneously that has output dependency is the same as the case where the instruction is cancelled in the processor.

As explained up to this point, the simulation apparatus of the present invention is intended for the processor that executes a plurality of instructions simultaneously and performs simulation on an instruction-by-instruction basis. Therefore, it is possible to break an instruction for every unit of instructions that are executed simultaneously instead of breaking it for every group of instructions. Also, there is an effect of giving a software developer the illusion that respective instructions are simulated one-by-one in sequential order.

Furthermore, the simulation apparatus can simulate the number of cycles of the target processor correctly because it performs a two-step simulation that comprises a simulation for every cycle of a group of instructions and a simulation on an instruction-by-instruction basis.

Also, it is possible to simulate the number of cycles of the target processor correctly even when the target processor has a forwarding unit, when interlock occurs upon receiving a delay instruction, and when it has a cancellation unit.

Further information regarding the technical background of this application is incorporated herein by reference to Japanese Patent application No. 2002-360362, filed Dec. 12, 2002.

BRIEF DESCRIPTION OF THE DRAWINGS

These and other subjects, advantages and features of the invention will become apparent from the following description thereof taken in conjunction with the accompanying drawings that illustrate a specific embodiment of the invention. In the Drawings:

FIG. 6 is a diagram showing an example of a group of instructions to be pipeline processed.

FIG. 7 is a diagram explaining the number of cycles of the pipeline.

FIG. 8 is a diagram showing the operation timing of the pipeline stage including forwarding.

FIG. 9 is a diagram showing another example of a condition when an instruction is cancelled.

FIG. 22 is a diagram showing the first program example to be simulated.

FIG. 23 is a diagram showing the second program example to be simulated.

FIG. 24 is a diagram showing the third program example to be simulated.

FIG. 25 is a diagram showing the fourth program example to be simulated.

FIG. 26 shows an example of a command that indicates simulation for every cycle of a group of instructions.

FIG. 27 shows an example of a command that indicates simulation on an instruction-by-instruction basis.

DESCRIPTION OF THE PREFERRED EMBODIMENT(S)

<The Outline of the Simulation System>

Figure 1:
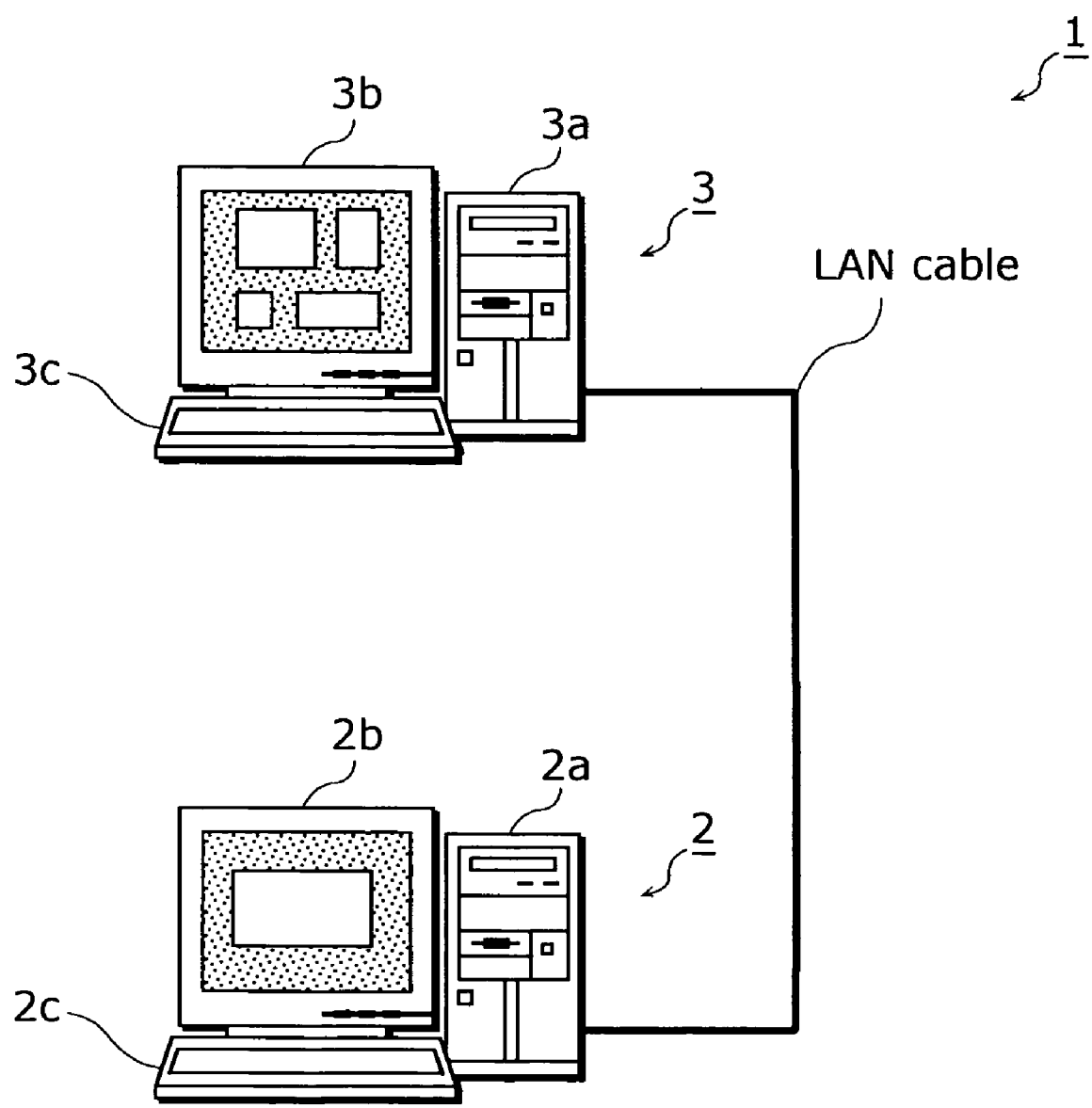
FIG. 1 is a diagram showing the appearance of the simulation system in the embodiment of the present invention.

FIG. 1 is a diagram showing the appearance of the simulation system 1 in the embodiment of the present invention. The simulation system 1 in FIG. 1 comprises a simulation apparatus 2 and a debug apparatus 3.

The simulation apparatus 2 is an apparatus for simulating operations by a processor that executes a plurality of instructions simultaneously and comprises a body apparatus 2a, a display apparatus 2b and an input apparatus 2c. It is constructed in a way that the execution results from executing a plurality of instructions to be executed simultaneously in the processor one-by-one in order are sent to the debug apparatus 3 via a LAN cable. In other words, the simulation apparatus 2 displays the execution results on an instruction-by-instruction basis to a user via the debug apparatus 3 upon receiving a step operation instruction on an instruction-by-instruction basis or a break point specification on an instruction-by-instruction basis from a user via the debug apparatus 3. The body apparatus 2a performs the above-mentioned simulation by executing a simulation software. The display apparatus 2b and the input apparatus 2c are used when starting and finishing the execution of the simulation software.

The debug apparatus 3 comprises a body apparatus 3a, a display apparatus 3b and an input apparatus 3c. It functions as a user interface to the simulation apparatus 2, notifies the simulation apparatus 2 of operational indications upon receiving the operations such as a step operation on an instruction-by-instruction basis or a break point specification on an instruction-by-instruction basis from a user, and receives and displays the simulation results on an instruction-by-instruction basis from the simulation apparatus 2. The body apparatus 3a provides a user interface function by executing the debug software, sends and receives the simulation execution instruction to the simulation apparatus 2 or the responses from it. The display apparatus 3b displays the simulation execution results on an instruction-by-instruction basis or the like. The input apparatus 3c receives various user operations.

Figure 2:
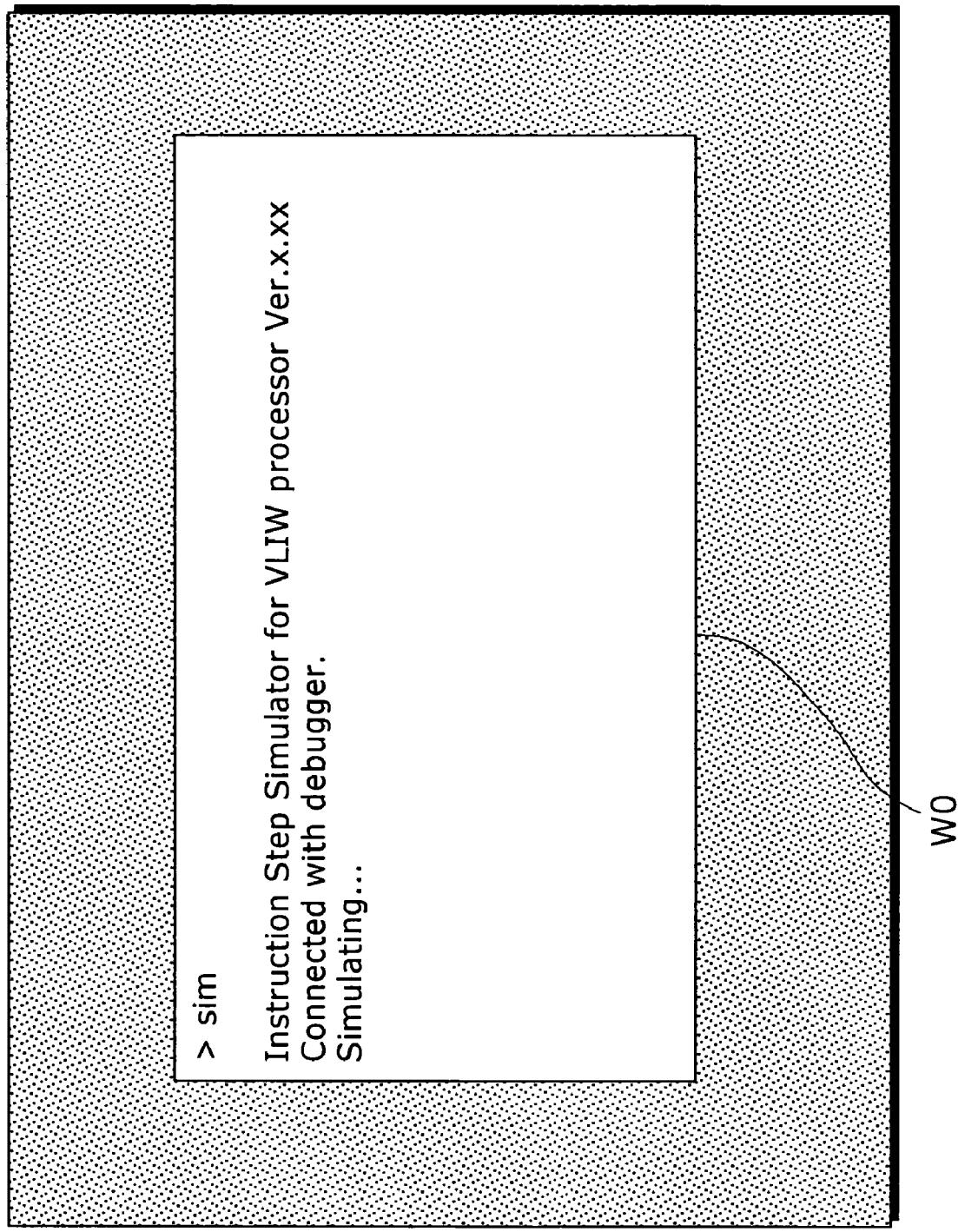
FIG. 2 is an example of the displayed contents after starting the simulation software in the simulation apparatus.

FIG. 2 shows an example of the display contents after starting the simulation software in the simulation apparatus 2. In FIG. 2, "W0" is a console window and it shows the execution state after the simulation software is started. This state enables a software developer to use the simulation apparatus 2 via the debug apparatus 3.

Figure 3:
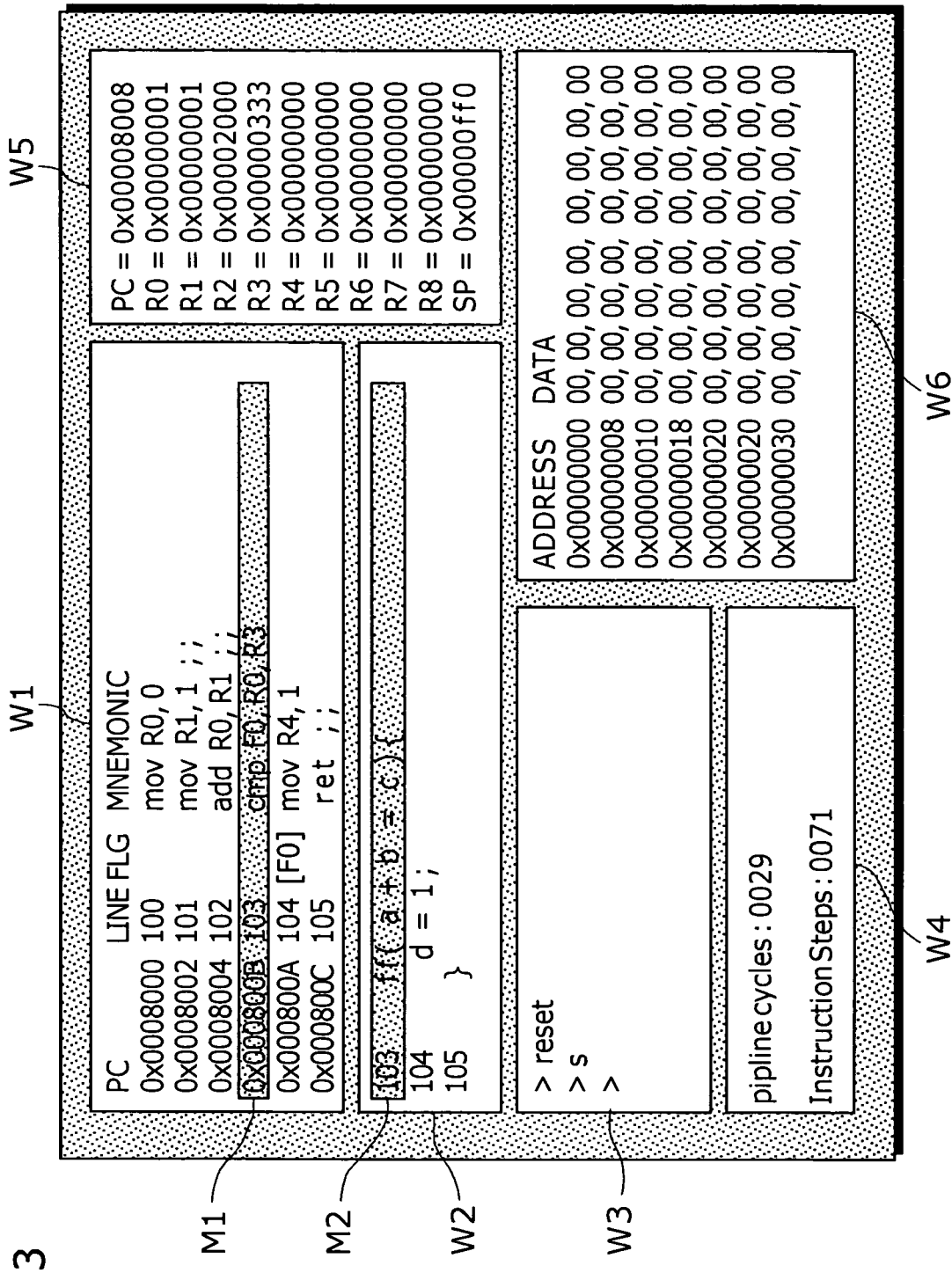
FIG. 3 is an example of the contents displayed while executing debug software in the debug apparatus.

FIG. 3 is an example of the display contents in the simulation of the debug software in the debug apparatus 3. In FIG. 3, "W1" is a code display window displaying a program to be debugged, "W2" is a source display window displaying a source program to be debugged, "W3" is a command input window for inputting a command for various simulations through user operations, "W4" is a state display window displaying the number of cycles and the number of steps showing the number of simulated instructions or the like on the condition that simulation is executed in the target processor, "W5" is a register contents display window displaying register data and "W6" is a memory contents display window displaying the memory data. "M1" is a stop instruction mark showing the leading instruction (that is called "stop instruction" from here) of instructions that have not been simulated yet in the simulations performed on an instruction-by-instruction basis, and "M2" is a stop line mark showing program lines in the source program corresponding to the stop instruction.

Figure 4:
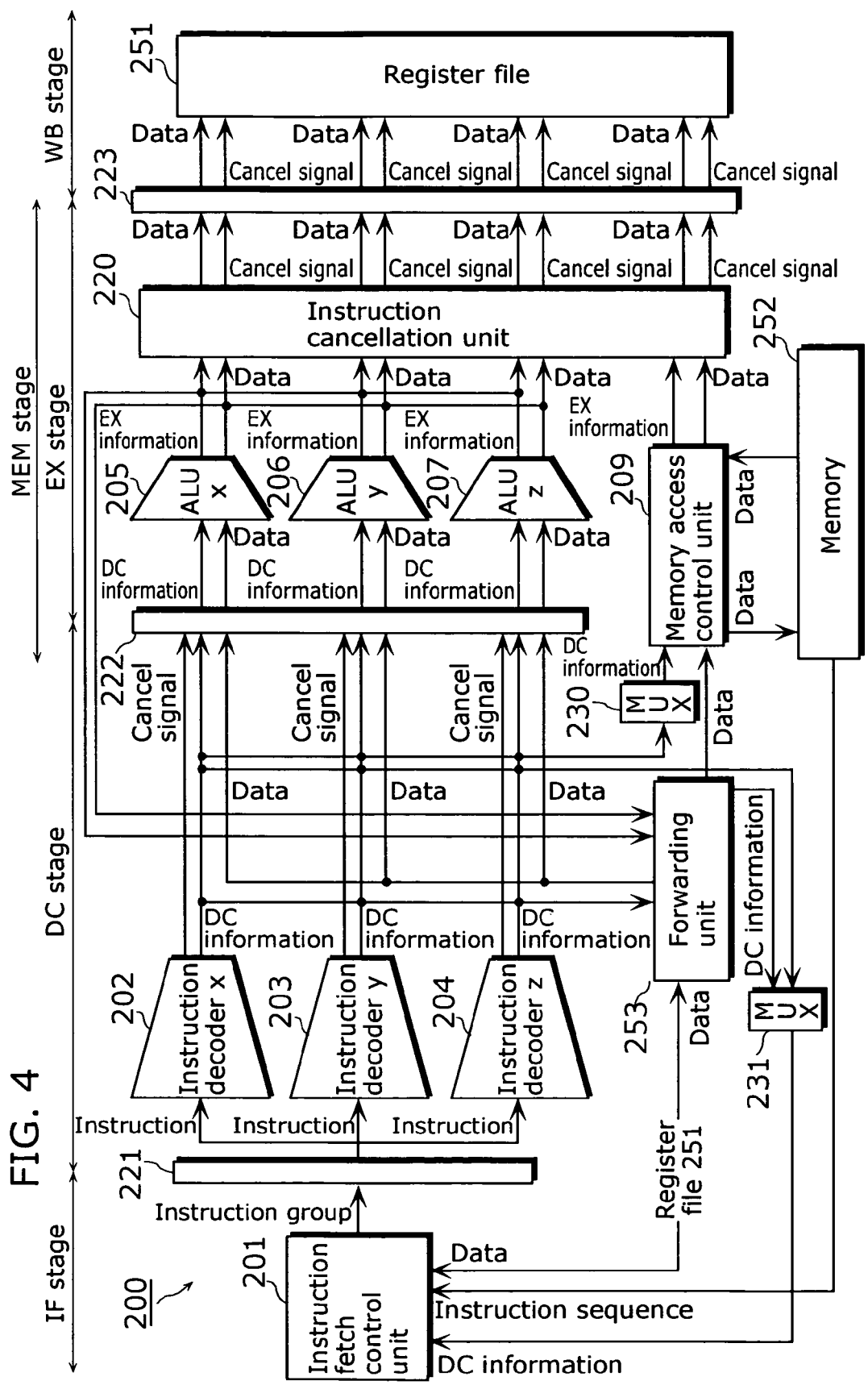
FIG. 4 is a diagram showing the structure of a processor to be a target of the simulation apparatus.

The code display window W1 displays program count values (the column of PCs in FIG. 3) showing the instruction address of the program to be debugged, line numbers (the column of LINEs), flags (the column of FLGs), mnemonics (the column of MNEMONICs) and the like, plus the stop instruction mark M1. Here, flag [F0] shows whether the instruction is valid or not based on the value of flag [F0] in the status flag register that is equipped in the VLIW processor 200, and the flag [F0] can be reset according to the comparison result in the compare instruction (cmp instruction) made just before. This flag F0 is used, for example, in an execution statement that depends on the condition of an "if statement" in the source display window W2 by reflecting the result from checking whether the condition of the conditional branch instruction is "satisfied" or "not satisfied". For example, the mov instruction in the 104th line of FIG. 4 is a conditional execute instruction setting the value of the flag [F0] as its execution condition, it is executed as a valid instruction when [F0] is 1 while it is not executed as an invalid instruction when [F0] is 0. Also, ";;" (two semicolons) in the code display window W1 shows the border of instructions to be executed simultaneously in the target processor and it is used for, for example, separating two instructions in data dependency that cannot be executed simultaneously from each other so as to move the latter instruction of the two into the next group of instructions.

Note that it is possible to construct another simulation system in a way that it executes both the simulation software and the debug software using a single computer although the simulation system 1 shown in FIG. 1 is composed of two computers of a computer (the simulation apparatus 2) that executes the simulation software and a computer (the debugger 3) that executes the debug software.

<target processor>

Next, the specification of the target processor of the simulation system 1 will be explained with reference to FIG. 4 to FIG. 11.

FIG. 4 is a block diagram showing the structure of the VLIW processor to be simulated. As shown in FIG. 4, the processor 200 has a four-stage pipeline structure comprising an IF (instruction fetch) stage, a DC (decode) stage, an EX/MEM (execution/memory access) stage and a WB (write back) stage. The processor 200 comprises an instruction fetch control unit 201 that fetches a group of instructions in the IF stage, instruction decoders 202 to 204 that can simultaneously decode, at the maximum, three instructions fetched in the DC stage, arithmetic logic units 205 to 207 (ALU) that simultaneously executes, at the maximum, three instructions according to the decode result in the EX stage, a memory access control unit 209 that executes an instruction in the MEM stage when the decoded instruction is a memory access instruction, an instruction cancellation unit 220 that cancels all or part of the execution contents, pipeline registers 221 to 223 that sends the information on the instruction to the next stage, a multiplexer 230 that selects the decode information when the decoded instruction is a memory access instruction, a multiplexer 231 that selects decode information on condition that the decoded instruction is a branch instruction, a register file 251 that comprises a plurality of general-purpose registers, a memory 252 that stores a program and data and a forwarding unit 253.

Here, the instruction fetch control unit 201 issues the instruction decoders 202 to 204 so as to place the instructions in the instruction address order from small to large. This is because it is constructed in a way that the same result as the case where a plurality of instructions to be executed simultaneously are executed in the order of instruction decoder number from 202 to 204 in cooperation with the instruction cancellation unit 220.

Figure 5:
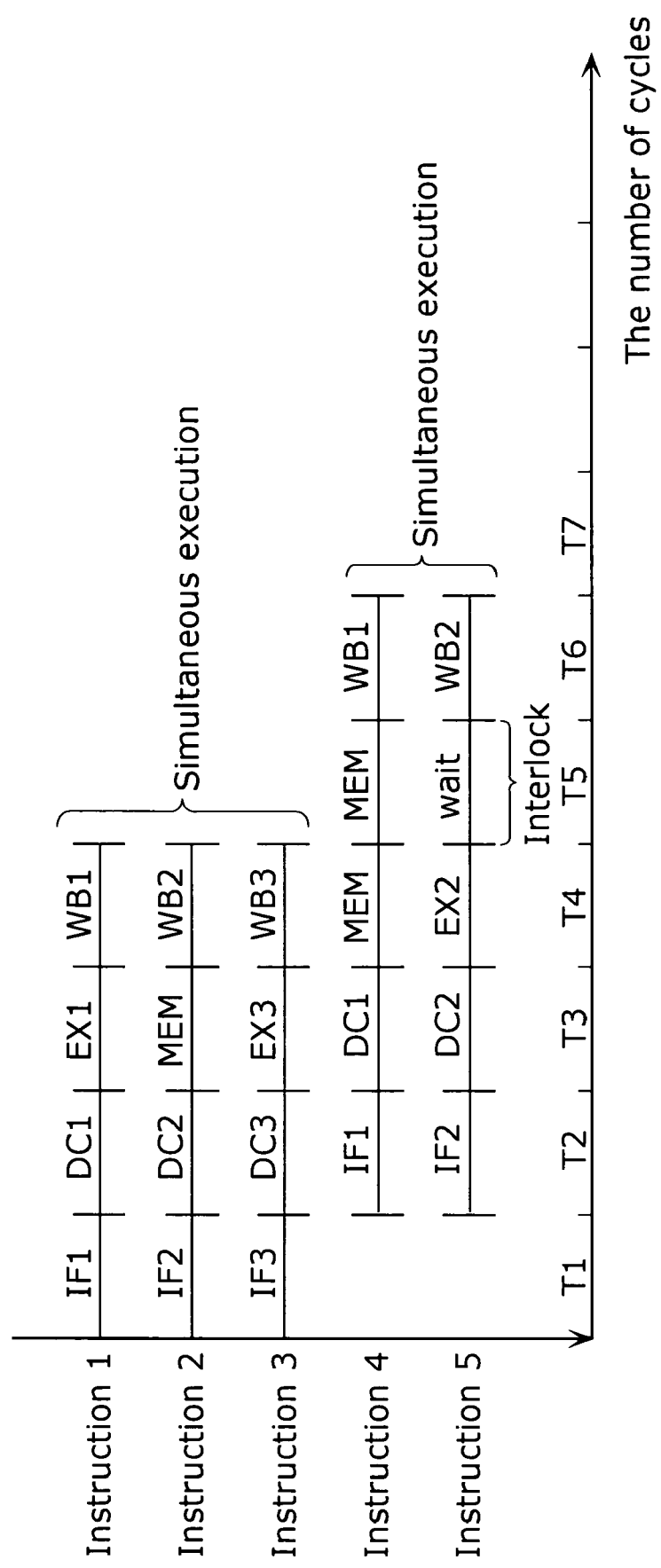
FIG. 5 is a diagram showing the operation timing of the pipeline stage of the target processor.

FIG. 5 is a diagram showing the flow of the pipeline processing of the VLIW processor 200. In FIG. 5, the vertical axis (an arrow pointing downward) shows the placement order of instructions placed in the program to be executed and the horizontal axis shows the number of cycles. FIG. 5 shows that DC1 to DC3 are processed in the instruction decoders 202 to 204, EX1 to EX3 are processed in the ALUs 205 to 207, MEM is processed in the memory access control unit 209. "Wait" means the occurrence of interlock. "T1", "T2" and the following "T plus numbers" are cycles for every stage time. Also, the pathway where instructions are processed by way of the instruction decoder 202 and the ALU 205 (the order is: first, IF1; second, DC1; third, EX1; and lastly, WB1 in the pipeline stage) is called "slot x". Likewise, the pathway starting from IF2 via DC2 and EX2 to WB2 is called "slot y", and the pathway starting from IF3 via DC3 and EX3 to WB3 is called "slot z". Further, instructions in the "slot x" is called "instruction x", "slot y" and "slot z" are called "instruction y" and "instruction z" respectively in the same way.

FIG. 6 shows an example of instructions 1 to 5 shown in FIG. 5. As to each instruction, an instruction address, a mnemonic code, instruction execution contents and a resource to be updated by executing the instruction are written in FIG. 6. Here, the resource includes registers and a memory. Only related resources are shown in FIG. 6. Mnemonic codes "sub", "add", "ld", "st" and "or" mean "subtraction instruction", "addition instruction", "load instruction" for reading data from a memory and writing the data on the register, "store instruction" for storing register data on a memory and "logical OR instruction" respectively. R0 to R6 mean registers 0 to 6, and "+" of "R4+" means post increment meaning that 4 is added at the last stage of the execution of the instruction. Also, in the representations of the execution contents of instructions, "=" means "assignment", "mem (R4)" means "memory data" where the contents of the R4 is the address, and "|" means "logical OR" respectively.

Also, the MEM stage of the store instruction takes two cycles, and the MEM stage of the load instruction and EX stages of other instructions take 1 cycle. An instruction that requires more cycles than the number of pipeline stages (four cycles are required in the case of the VLIW processor 200) like in the case of the store instruction is called "delay instruction" below, and the instruction to be processed in the same number of cycles as pipeline stages is called "normal instruction".

It is assumed that the MEM stage of the store instruction takes two cycles, and the MEM stage of the load instruction takes 1 cycle in order to simplify the explanation, but there is no problem even when the numbers of cycles of MEM stages required for the load instruction and the store instruction dynamically change. In other words, the target processor waits for a response (ACK) from an access destination (a memory device or i/o) on a cycle-by-cycle basis in the MEM stage and finishes the memory access at the specified cycle.

The instruction group 1 comprises normal instructions 1 to 3 and it is processed in the four cycles from T1 to T4 as shown in FIG. 5. The instruction group 2 takes five cycles for processing time because of occurrence of interlock because the instruction group 2 includes a normal instruction of instruction 5 and a delay instruction of instruction 4.

FIG. 7 is a diagram showing the relation between the cycle concerning the instruction sequence of FIG. 6 and a resource to be updated. As instructions 1 to 3 of the instruction group 1 finishes in four cycles, in the cycle N+1, registers R0, R2, R3 and R4 that are specified as destinations by the instructions 1 to 3 are updated. As the instruction group 2 has not been finished yet in the cycle N+2 because of the interlock, any existing resource is not updated. As the instruction group 2 finishes in the cycle N+3, mem (R4), R4 and R5 that are specified as destinations by the instructions 4 and 5 are updated.

FIG. 8 is a diagram showing an example of an instruction sequence on condition that an instruction is cancelled by the instruction cancellation unit 220. The instructions 6 and 7 are instructions to be executed simultaneously in FIG. 8, and the instruction 8 is an instruction to be executed solely. The compare instruction (cmp instruction) of the instruction 6 resets the flag F0 depending on the comparison result. The addition instruction (add instruction) of the instruction 7 is executed on condition that the flag F0 is 1, but it is not executed on condition that the flag F0 is 0.

As to instructions 6 and 7 that are being executed simultaneously, the instruction cancellation unit 220 cancels the instruction 7 depending on the result of the instruction 6. In other words, the instruction cancellation unit 220 cancels the instruction 7 by prohibiting the execution result of the instruction 7 from being written on the register or a memory when the flag F0 is reset to "0" by the instruction 6.

In other words, on condition that there is a conditional branch instruction in the plurality of instructions that are being executed simultaneously, the instruction cancellation unit 220 can cancel the instruction that follows a conditional branch instruction based on whether the condition is satisfied or not. In this way, the cancellation unit 220 makes it possible to conditionally branch from an arbitrary instruction in a plurality of instructions to be executed simultaneously. For example, the conditional statement (IF statement) with a stop line mark shown in FIG. 3 is executed as a cmp instruction with a stop instruction mark and a mov instruction with a flag F0 (this two instructions are used in the same way as the instructions 6 and 7).

The above-mentioned instructions 6 and 7 do not have any sequential relation basically because they are the instructions to be executed simultaneously, but the instruction cancellation unit 220 handles those instructions on assumption that, logically, the instruction 6 precedes the instruction 7.

Also, even when an unconditional branch instruction is included in the plurality of instructions and the instructions that are not executed because of a branch are issued simultaneously, the instruction cancellation unit 220 cancels the instruction.

The VLIW processor 200 has an architecture capable of obtaining the same result as the case where a plurality of instructions to be executed simultaneously are executed in the order of instruction addresses because the processor can conditionally branch from an arbitrary instruction in the plurality of instructions to be executed simultaneously while it executes a plurality of instructions simultaneously by having the instruction cancellation unit 220.

FIG. 9 is a diagram showing another example of an instruction sequence on condition that an instruction is cancelled by the instruction cancellation unit 220. In FIG. 9, the instructions 12 to 14 are executed simultaneously. However, the load instruction (ld instruction) 13 and the move instruction (mov instruction) 14 specify the register R1 as the destination, which means that both the instructions are in a conflict for the register R1 in writing (this relation is called "output dependency"). When detecting output dependency, the instruction cancellation unit 220 cancels writing in the register R1 by the instruction 13 whose address is smaller than the other. Consequently, the execution result of the instruction 14 is reflected in the register R1. This execution result is brought because the employed architecture is capable of obtaining the same result as the case where a plurality of instructions to be executed simultaneously are executed in the order of instruction addresses.

Figure 10:
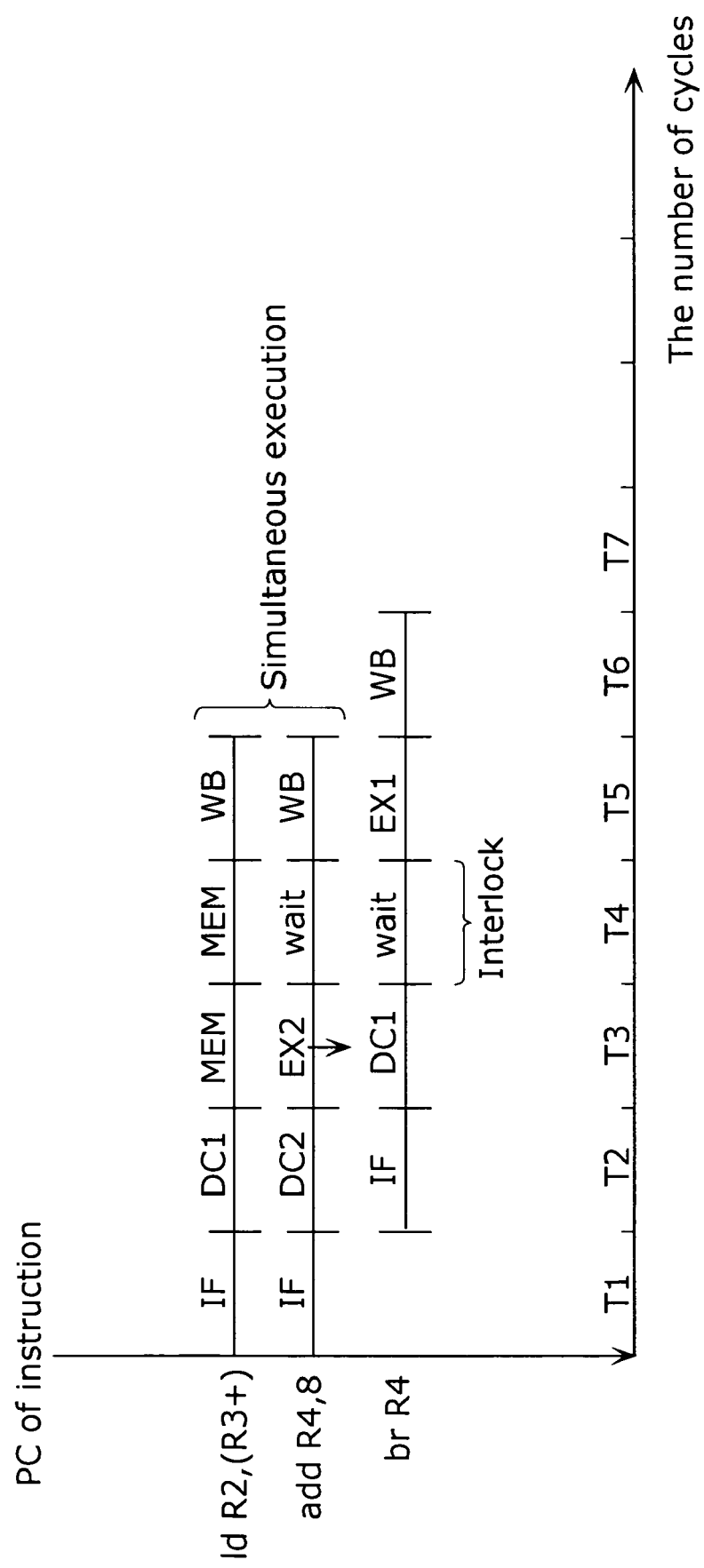
FIG. 10 is an illustration showing the pipeline processing including forwarding.
Figure 11:
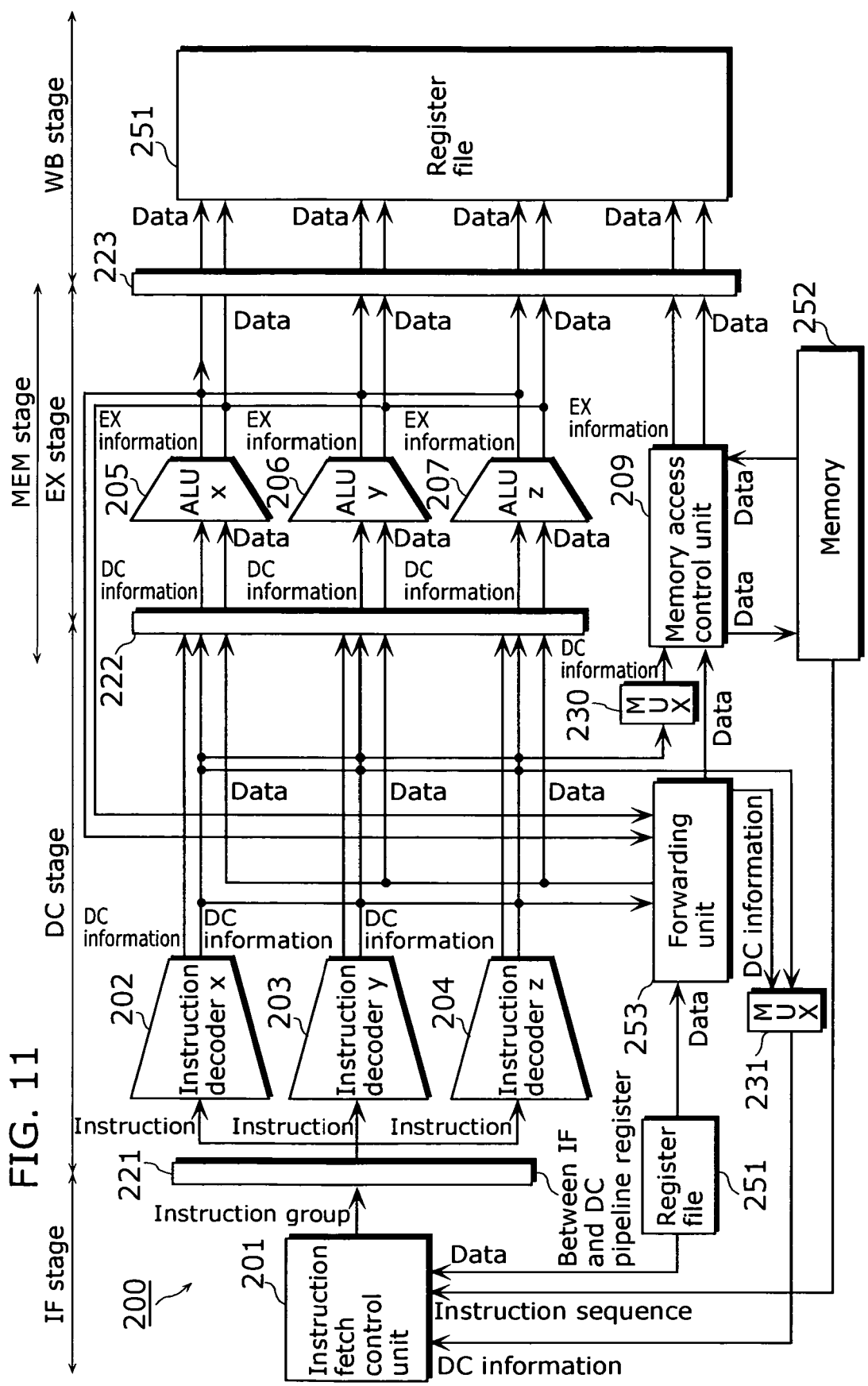
FIG. 11 is a diagram showing the structure of another processor to be a target of the simulation apparatus.

FIG. 10 is an illustration showing the pipeline processing including forwarding by the forwarding unit 253. It is assumed that the load instruction (ld R2, (R3+)) and the addition instruction (add R4, 8) are issued simultaneously in FIG. 10, and the branch instruction (br R) is issued solely. Also, the load instruction requires two cycles for the MEM stage.

As the execution result R4 of the addition instruction (add R4, 8) is used by the branch instruction (br R4), these two instructions are in data dependency. If starting the branch instruction after the WB stage of the addition instruction finishes, a two cycle penalty stemming from the data dependency occurs (the DC1 stage is started at T6 cycle).

To avoid this, when a data dependency exists between one of instructions (that is, the depended instruction of the instructions that are in data dependency) of the group of instructions that is being executed and one of instructions (that is, the depending instruction of the instructions that are in data dependency), the forwarding unit 253 fetches data obtained as the execution result of depended instruction (which is the preceding instruction) in the EX stage and stores it temporally, and directly outputs the data as operand data when starting the EX stage or the MEM stage of the depending instruction (which is the following instruction and this process is called forwarding).

Further, making the contents written in the WB stage in a way that the structure can be read out in the DC stage of the same cycle (this is called "read after write") makes it possible to execute the following instructions where data dependency exists without penalties before the WB stage is completed.

In the case of FIG. 10, the R4 data 8 obtained as the execution result of the depended instruction (add R4, 8) in the EX2 stage is output to the instruction fetch control unit 201 as an address (8) specified by the forwarding unit 253 in a form of an operand of the depending instruction (br R4) via the multiplexer 231 in the DC1 stage. Here, the reason why data is output in the DC1 stage is that the structure where the decode information (DC information) is output in the IF stage of the next group of instructions from the midway of the DC stage as shown in FIG. 4 is made. In this way, the VLIW processor 200 solves the penalties stemming from the data dependency by having the forwarding unit 253.

Also, in FIG. 10, memory access is completed in the cycle T4 because the MEM stage of the load instruction (ld R2, (R3+)) requires two cycles. Also, addition instruction (add R4, 8) is completed in T3. In this point, both the instructions are executed in an order different from the order of their instruction addresses. These two instructions are executed in the order of instruction addresses when the EX3 stage is executed in the cycle T4, but when there is dependency, penalty to the depend instruction (br R4) occurs, and thus delay occurs. Therefore, the VLIW processor 200 may exceptionally execute instructions in an order different from the order of instruction addresses. Even in the case, the same execution result as the case where instructions are executed in the order of instruction addresses is obtained.

Note that the target processor is not limited to the one shown in FIG. 4, in other words, any processor capable of executing a plurality of instructions simultaneously can be used. For example, the VLIW processor shown in FIG. 11 can be used. Eliminating the instruction cancellation unit 220 from the VLIW processor shown in FIG. 4 makes the structure of the VLIW processor of FIG. 11.

<The Structure of the Simulation System 1>

Explanation on the simulation system 1 on assumption that the target processor shown in FIG. 4 to FIG. 11 in the embodiment of the present invention is used will be continued.

Figure 12:
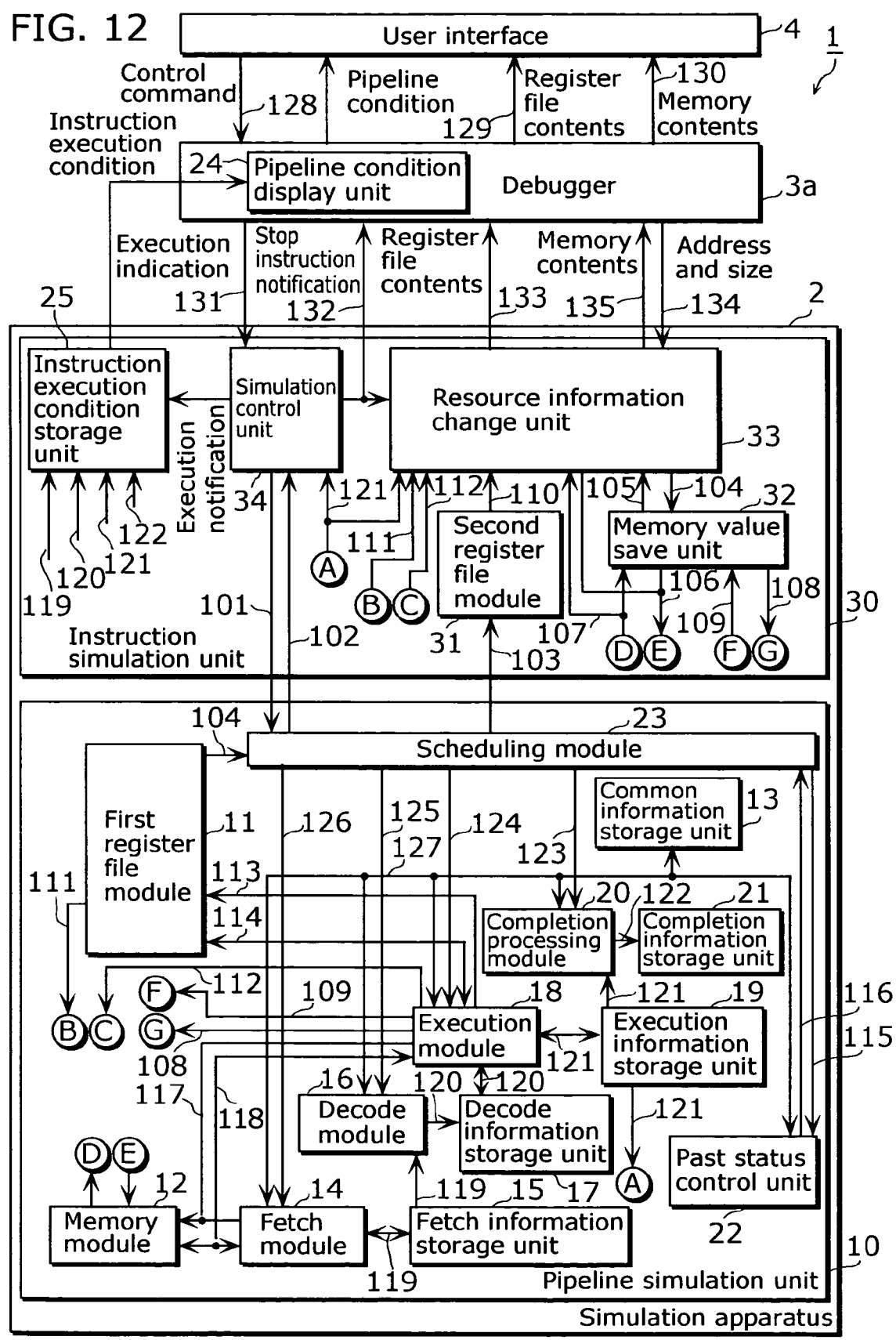
FIG. 12 is a function block diagram showing the structure of the simulation system.

FIG. 12 is a functional block diagram showing the structure of the simulation system 1. The simulation system 1 comprises a user interface 4, a debugger 3a, a simulation apparatus 2 in FIG. 12.

The user interface 4 corresponds to the display apparatus 3b and the input apparatus 3c shown in FIG. 1, receives user operations that instruct it to execute the simulation, the execution steps on an instruction-by-instruction basis or the like and displays the simulation result. Naturally, when receiving the operation indicating its execution of the simulation where a plurality of instructions to be executed simultaneously are executed not on an instruction-by-instruction basis but on a cycle-by-cycle basis for executing them simultaneously, the user interface 4 displays the simulation result.

The debugger 3a corresponds to the body apparatus 3a shown in FIG. 1, receives various control commands 128 such as the indication of step execution on an instruction-by-instruction basis and the specification of a break point via the user interface 4, and displays the register file contents 129 where the simulation result on an instruction-by-instruction basis or the memory contents 130 are reflected on the display 3b as responses to the various control commands via the user interface 4. Also, the debugger 3a sends the simulation execution indication 131 (which indicates the simulation execution on an instruction-by-instruction basis) and the memory address and the size 134 to the simulation apparatus 2 and receives a stop instruction notification 132, a register data 133 and a memory contents 135 from the simulation apparatus 2 as responses to the simulation execution indication 131 or the memory address and the size 134. In addition, the debugger 3a has a pipeline status display unit 24 and generates a display image that shows the simulation result. The pipeline status display unit 24 generates a display image that shows the simulation result on an instruction-by-instruction basis when step execution on an instruction-by-instruction basis is indicated by a user via the user interface 4 and another display image that shows the simulation result on a cycle-by-cycle basis when step execution on a cycle-by-cycle basis is indicated by a user via the user interface 4. The user can freely select the simulation result of the step execution on an instruction-by-instruction basis or the simulation result of the step execution on a cycle-by-cycle basis.

The simulation apparatus 2 corresponds to the body apparatus 2a shown in FIG. 1 and comprises a pipeline simulation unit 10 that simulates the simultaneous execution of the plurality of instructions (a group of instructions) on a cycle-by-cycle basis operated by the target processor shown in FIG. 4 and an instruction simulation unit 30 that generates the simulation result of the group of instructions on an instruction-by-instruction basis based on the simulation result. The simulation apparatus 2 generates the simulation result on an instruction-by-instruction basis giving the debugger 3a the illusion that the simulation is being executed on an instruction-by-instruction basis by the two-step simulation that generates the status before and the status after the simulation on an instruction-by-instruction basis in the instruction simulation unit 30 based on the simulation result for every group of instructions made by the pipeline simulation unit 10.

The pipeline simulation unit 10 comprises the first register file module 11, a memory module 12, a common information storage unit 13, a fetch module 14, a fetch information storage unit 15, a decode module 16, a decode information storage unit 17, an execution module 18, an execution information storage unit 19, a completion processing module 20, a completion information storage unit 21, a past status update control unit 22 and a scheduling module 23.

The instruction simulation unit 30 comprises the second register file module 31, a memory value save unit 32, a resource information change unit 33, a simulation control unit 34 and an instruction execution condition storage unit 25.

First, the meaning of each arrow in FIG. 12 will be explained prior to explaining each component of the pipeline simulation unit 10 and the instruction simulation unit 30.

"101" is a simulation execution indication of a group of instructions for one cycle that is output from the simulation control unit 34 to the scheduling module 23, and "102" is a response to the simulation execution indication. "103" is register data that is copied from the first register file module 11 to the second register file module 31 as a part of the status before the simulation of the group of instructions is executed.

"104" is the memory address and the size. "105" is memory data whose address is specified to the "104", and the memory data is the memory contents before storing by the store instruction when "104" is a store destination address specified by the store instruction. "106" is the memory address and the size supplied to the memory module 12, and "107" is memory data whose address is specified to "106". "108" and "109" are data of the same contents as "104" and "105" and these data are supplied from the execution module 18 to the scheduling module 23. "110" is the register file contents of the second register file module 31, and "111" is the contents of the first register file module 11.

"112" is an instruction execution notification that provides notification that the one-cycle simulation in the EX stage has been executed from the execution module 18. "113" is the identification of the register number and R/W, and "114" is a register data specified by "113". "115" is an inquiry for asking whether the second register file module 31 can be updated or not, "116" is an update prohibition notification showing whether updating the second register file module 31 is prohibited or not. "117" is the address, the size and the identification of R/W to the memory module 12, and "118" is memory contents, that is, the memory data specified by "117". "119" is fetch information, "120" is decode information, "121" is execution information and "122" is completion information.

"123" to "126" are execution indications output to the completion processing module, the execution module, the decode module and the fetch module respectively, and these instructions are output in this sequential order (more specifically, respective modules are called in this sequential order). "127" shows the value of the interlock flag contained in the common information to be used by the respective modules in common. The interlock flag means the occurrence of interlock. The common information includes a stall flag that means the occurrence of a pipeline stall, a branch destination address specified by a branch instruction along with an interlock flag. "128" shows various control commands, "129" shows a register data for display and "130" shows memory data for display. "131" shows a simulation execution instruction or a step execute instruction on an instruction-by-instruction basis, "132" shows a stop instruction notification that is sent as a response to "131", "133" shows a register data showing the status before execution of the stop instruction, "134" shows the memory address and the size and "135" is the memory contents whose address is specified by "134" and the memory contents shows the status existed before the stop instruction was executed.

Next, each component of the pipeline simulation unit 10 and the instruction simulation unit 30 will be explained.

<Pipeline Simulation Unit 10>

The first register file module 11 has the same register structure as the register file 251 of the target processor.

The memory module 12 has the memory structure of the target processor and stores the program to be debugged.

The common information storage unit 13 stores common information including an interlock flag that shows the occurrence of interlock, a stall flag that shows the occurrence of a pipeline stall stemming from data dependency of specific instructions and the like. The interlock flag is set or reset by the module that caused interlock and it is referred to by respective modules. More specifically, the interlock flag is set at the first cycle in the delay instruction such as a store instruction by the execution module 18 and is reset at the second cycle. When an interlock flag is set when receiving the one-cycle execution indications 123 to 126 from the scheduling module 23, the respective modules perform wait operations.

<Fetch Module>

The fetch module 14 simulates the one-cycle operation of the IF stage of the target processor when receiving the execution indication 126 from the scheduling module 23. In other words, the fetch module 14 fetches a plurality of instructions (three instructions at the maximum here) should be executed simultaneously from the memory module 12 and stores them as fetch information 119 in the fetch information storage unit 15. When all the instructions in the fetch information storage unit 15 are valid, it does not store the fetch information in the fetch information storage unit 15. This is because the undecoded fetch information stored in the fetch information storage unit 15 is not updated.

Figure 13:
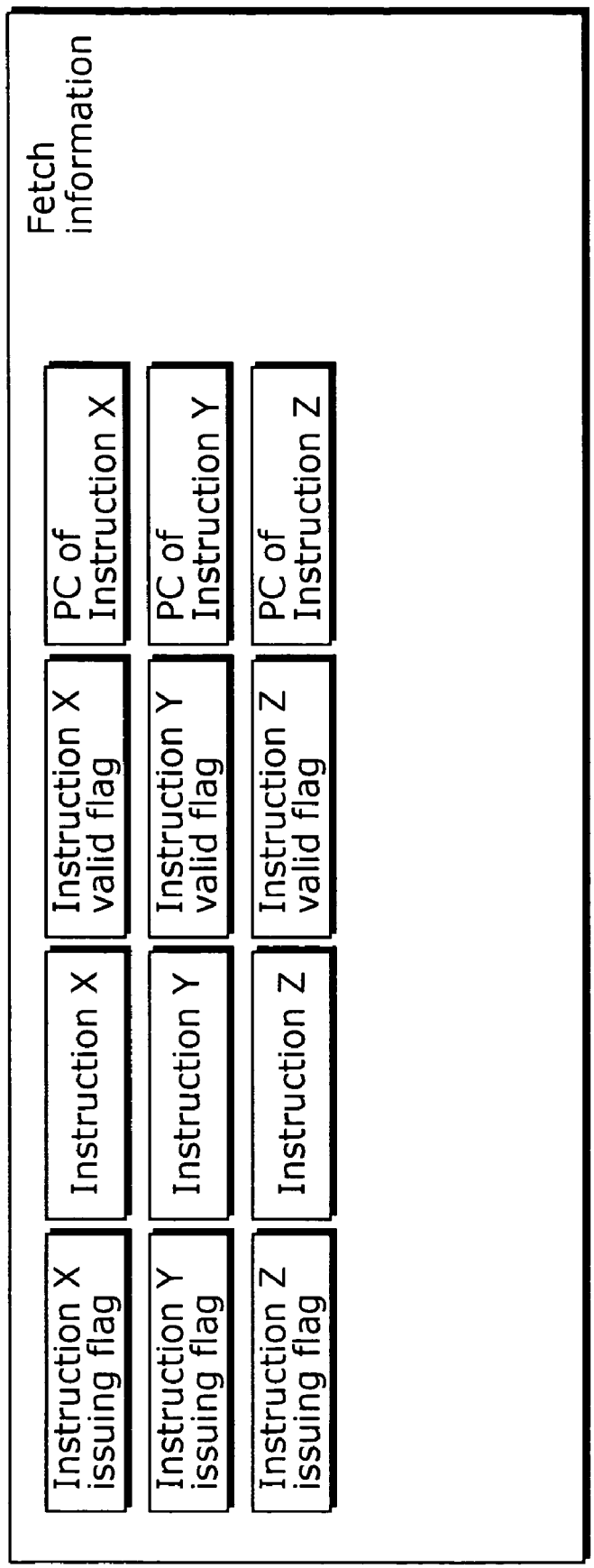
FIG. 13 is a diagram showing an example of fetch information.

An example of fetch information is shown in FIG. 13. The fetch information in FIG. 13 includes the instructions X to Z, instruction issue flags corresponding to the instructions X to Z, valid flags and instruction PCs. Here, "instruction X" is the instruction code of an instruction to be issued to the instruction decoder 202 in the target processor or the instruction code of the instruction x to be issued to the slot x. Likewise, "instruction Y" and "instruction Z" are the instruction codes of "instruction y" and "instruction z" issued to the instruction decoders 203 and 204 respectively. Therefore, the instruction addresses of the instructions X, Y and Z are in alphabetical order. The "instruction issue flag" shows whether the corresponding instruction is issued to the decode module 16 from the fetch module 14 via the fetch information storage unit 15. The "valid flag" shows whether the corresponding instruction is valid or not. Three valid flags of instructions X to Z become valid when the instructions should be executed simultaneously are three, two valid flags of instructions X and Y become valid when the instructions should be executed simultaneously are two, and the valid flag of instruction X becomes "1" (valid) when the instruction should be executed solely. The "instruction PC" means the instruction address corresponding to the contents of the fetch program counter in the target counter.

The fetch information storage unit 15 is included in a memory area for storing the fetch information shown in FIG. 13. The fetch information is referred to and changed by the fetch module 14 and the decode module 16.

<Decode Module>

The decode module 16 simulates the one-cycle operation of the DC stage of the target processor when the interlock flag 127 is not "1" at the time of receiving the execution indication 125 from the scheduling module 23. In other words, the decode module 16 reads out the fetch information from the fetch information storage unit 15 so as to decode the information and stores the decoding result as the decode information 120 in the decode information storage unit 17. At that time, the valid flags of the decoded instructions to the fetch information in the fetch information storage unit 15 are changed to "0" (invalid). As to the instructions whose valid flags are "0", the information on the instructions in the fetch information are included in the decode information as they are. Also, the decode module 16 stores the instruction issue flags in the read-out fetch information in the information storage unit 17 as they are (without changing these values). When the interlock flag is "1", the decode information on the decode information storage unit 17 is not updated.

Figure 14:
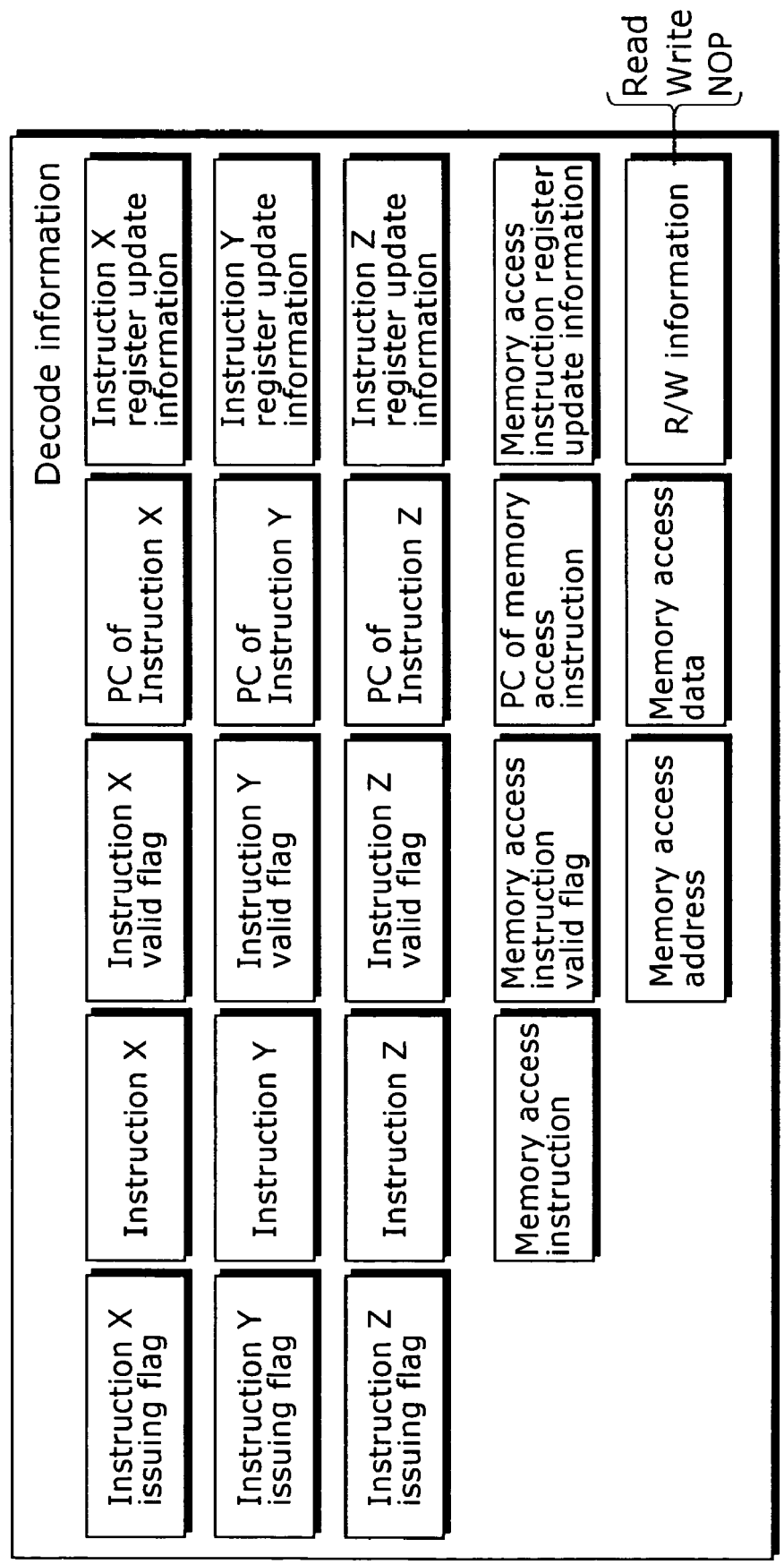
FIG. 14 is a diagram showing an example of decode information.

An example of the decode information will be shown in FIG. 14. As shown in FIG. 14, the decode information differs from the fetch information mainly in that register update information corresponding to the respective instructions X to Y, a memory access instruction, a valid flag, a PC, register update information, a memory access address, a memory access data and R/W information are newly added to the decode information. These differences will be mainly explained below while the explanations on the same points as the fetch information are omitted.

The "instruction PC" means an instruction address corresponding to the contents of the decode program counter instead of the contents of the fetch program counter in the target processor. The "register update information of the instruction X" shows the register (destination register) updated by the instruction X. The register update information of the instructions Y and Z are the same respectively. This information is used for detecting output dependency.

Respective pieces of information listed in the following memory access instruction in FIG. 14 are valid only when any of instructions X to Z is a memory access instruction, and they are invalid when none of instructions X to Z is a memory access instruction. The "memory access instruction" is the same instruction as any of instructions X to Z, and it is issued to the memory access control unit 209 from any of instruction decoders 202 to 204 via the multiplexer 230 or 231 in the target processor. The "valid flag" shows whether the memory access instruction is valid or not, and it is set to "1" (valid) as the initial value by the decode module 16. The "instruction PC" means the instruction address corresponding to the contents of the decode program counter in the target processor. The "memory access address" shows the memory address of the access destination. The "R/W information" shows "read" in the case of a load instruction, "write" in the case of a store instruction, and "NOP" when no memory access instruction is included. For example, the instruction PC of the instruction Z is the same as the instruction PC of the memory access instruction when the instruction Z is a load instruction (ld R0, (R1+)), but an operation code meaning (R1=R1+4) is set for the instruction Z in the decode information and an operation code meaning (R0=mem (R1)) is set for the memory access instruction. The register update information of the instruction Z becomes R1, and the register update information of the memory access instruction becomes R0. In this case, the operation code of the instruction Z and the operation code of the memory access instruction share the operation functions and correspond to sharing the operation functions of ALU 207 and the memory access control unit 209 of the target processor.

The decode information storage unit 17 is included in a memory area for storing the decode information shown in FIG. 14. The decode information is written in by the decode module 16 and read out by the execution module 18.

<Execution Module 18>

The execution module 18 simulates one-cycle operation of the EX/MEM stage of the target processor when receiving the execution indication 124 from the scheduling module 23. In other words, the execution module 18 reads out the decode information 120 from the decode information storage unit 17 and simulates the operation contents of the instructions as to instructions whose valid flags are "1" (valid) (more specifically, calls the instruction execution functions corresponding to the instructions) so as to update the first register file module 11. Here, instructions X, Y and Z are simulated in this alphabetical order, and the execution module 18 outputs instruction execution notification 112 that provides notification concerning whether any of instructions X, Y and Z has already executed or not every time each instruction is simulated.

When a delay instruction in a valid state (for example, a memory access instruction that requires a two-cycle MEM stage) is included in the decode information, the execution module 18 simulates the instructions X to Z except the memory access instruction in a plurality of instructions and finishes the simulation of the cycle setting the interlock flag in the common information storage unit 13 at "1" without simulating the memory access instruction in the case where any delay of the delay instruction is left (that is, in the first cycle). Also, the execution module 18 simulates the memory access to the memory module 12 when no delay of the delay instruction is left (that is, in the second cycle) and resets the interlock flag. At that time, when the memory access instruction is a memory write instruction, reads out the data before "write" so as to make it a part of the execution information.

As a result of this simulation, the execution module 18 stores the execution information in the execution information storage unit 19. Also, the execution module 18 changes the valid flags of the simulated instructions to "0" (invalid) to the decode information in the decode information storage unit 17.

Figure 15:
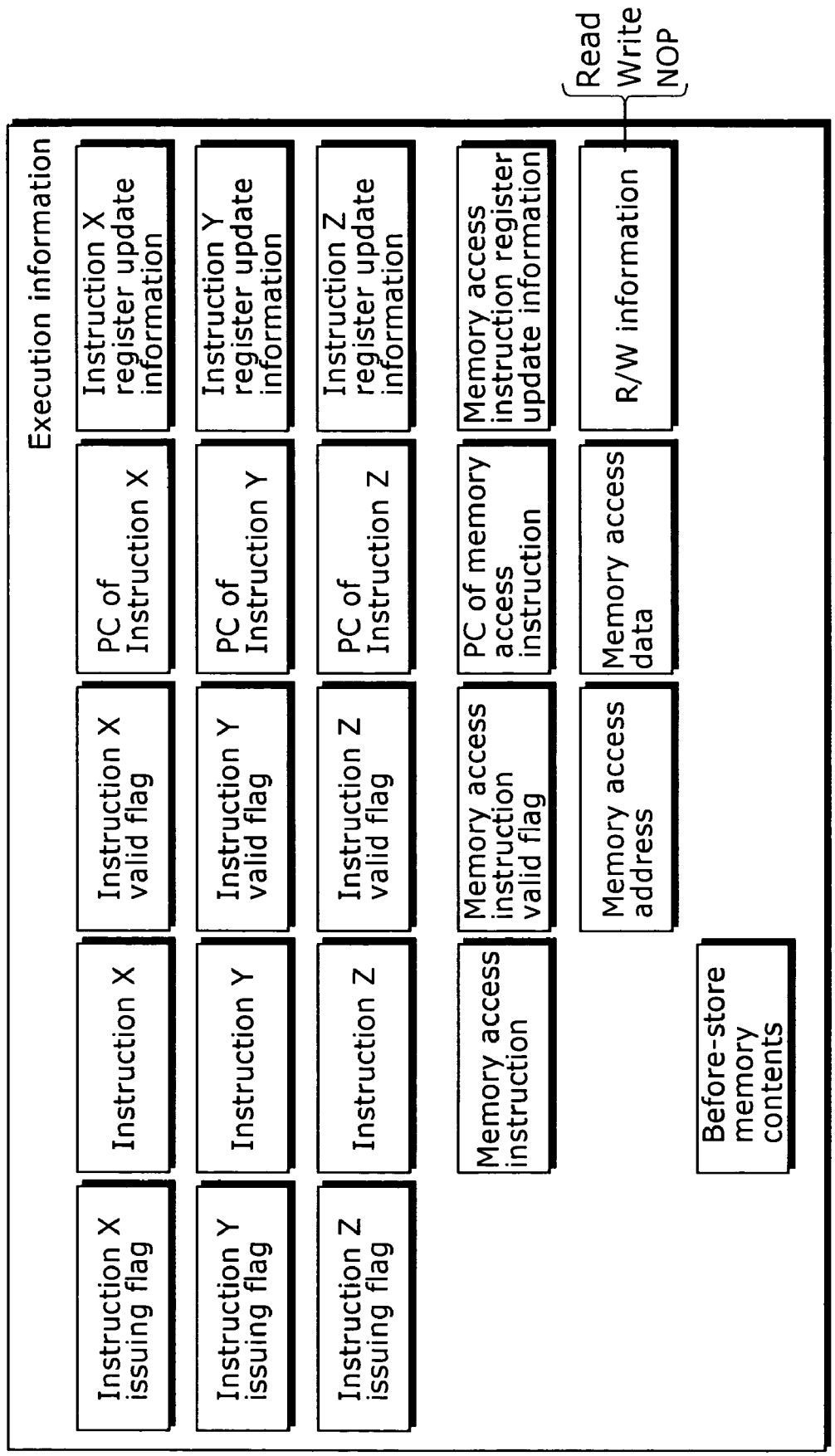
FIG. 15 is a diagram showing an example of execution information.

An example of the execution information will be shown in FIG. 15. The execution information in FIG. 15 differs from the decode information shown in FIG. 14 mainly in that before-store memory contents is added to the execution information. The difference is mainly explained below while the explanations on the same points as the decode information are omitted.

The "instruction PC" of instructions X to Y and the "instruction PC" of the memory access instruction mean instruction addresses corresponding to the contents of the execution program counter in the target processor. The "before-store memory data is the memory data before the "memory write" when the memory access instruction is a store instruction, is output to the memory value save unit 32, and is used for reconstructing the status before the execution of the memory access instruction.

The execution information storage unit 19 is a memory area for storing the execution information shown in FIG. 15.

The execution information is referred to and updated by the execution module 18 and the completion processing module 20.

<Completion Processing Module>

The completion processing module 20 simulates one-cycle operation of the WB stage of the target processor when the interlock flag 127 is not "1" at the time of receiving the execution indication 123 from the scheduling module 23. In other words, the completion processing module 20 reads out the execution information from the execution information storage unit 19, performs a WB (write back) operation as to the instructions whose valid flags are "1" (valid), and stores the completion information in the completion information storage unit 21. Also, the valid flags of the completed instructions are changed to "0" (invalid) to the execution information in the execution information storage unit 19.

However, write back to the register in the instructions except the memory access instruction has been already completed in the execution stage in this embodiment, most instructions do not need the completion processing.

Figure 16:
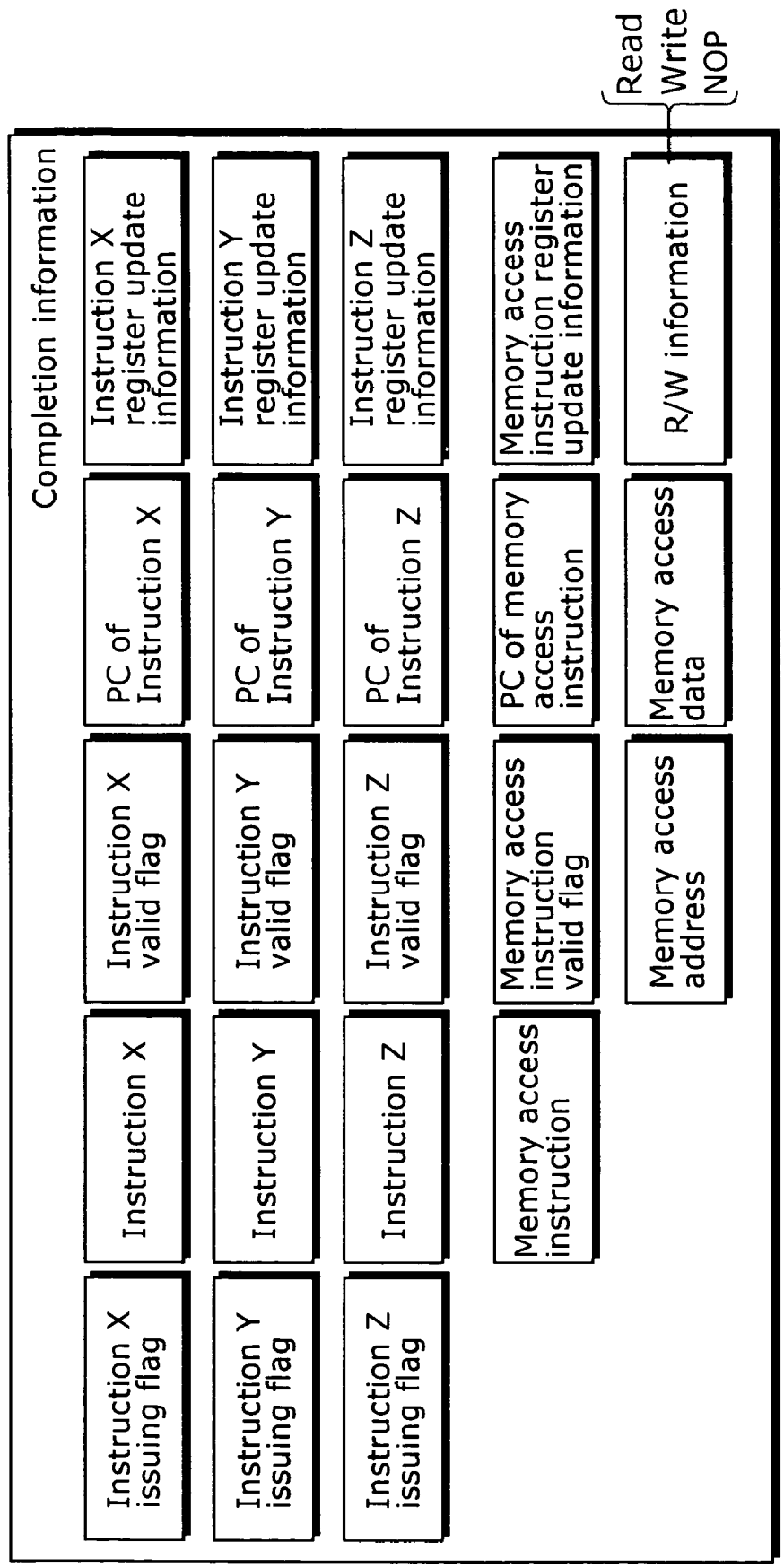
FIG. 16 is a diagram showing an example of completion information.

An example of the completion information will be shown in FIG. 16. The explanation on the completion information in FIG. 16 is omitted because it is the same as the execution information shown in FIG. 15. However, the "instruction PC" means the instruction address corresponding to the contents of the completion program counter in the target processor.

The completion information storage unit 21 is a memory area for storing the execution information shown in FIG. 16.

The past status update control unit 22 makes a response of update prohibition notification 116 that prohibits the data of the register file 251 from being copied from the first register file module 11 to the second register file module 31 when the interlock flag stored in the common information storage unit 13 is "1" or makes a response of update prohibition notification 116 that does not prohibit the data from being copied when the interlock flag is "0" in response to the inquiry 115 from the scheduling module 23. Here, the contents of the first register file module 11, which is the previous contents by one cycle normally, is stored in the second register file module 31. The reason why the past status update control unit 22 notifies the prohibition is that the register data in the state of before-EX/MEM stage is stored in the second register file module 31 when the EX/MEM stage takes two cycles because of the occurrence of interlock.

<Scheduling Module>

The scheduling module 23 makes a schedule so as to simulate the pipeline processing for one cycle that executes a plurality of instructions simultaneously when receiving the simulation execution instruction 101 and outputs the response 102 to the instruction simulation unit 30 after completing the one-cycle simulation.

Figure 17:
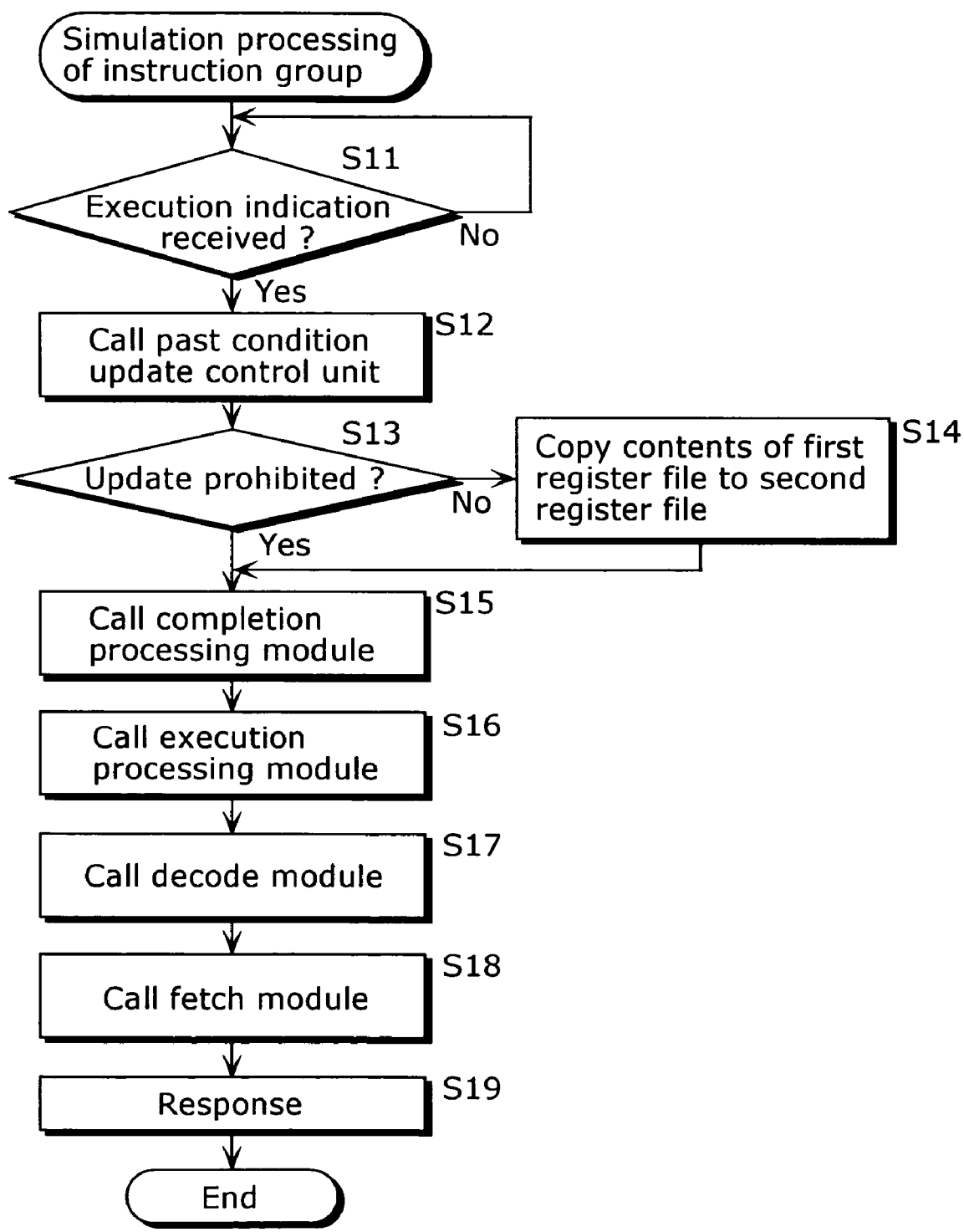
FIG. 17 is a flow chart showing the simulation processing of a group of instructions by a scheduling module.

FIG. 17 is a flow chart showing the simulation processing of a group of instructions by the scheduling of the scheduling module 23.

As shown in FIG. 17, the scheduling module 23 makes the inquiry 115 (S12) by calling the past status update control unit 22 when receiving the simulation execution instruction 101 (S11: yes) from the simulation control unit 34, and it copies the contents of the first register file module 11 to the second register file module 31 (S14) when the update prohibition notification 116 does not prohibit the second register file module 31 from being updated (S13: yes) as the response, or it does not copy the contents when the update prohibition notification 116 prohibits the second register file module 31 from being updated (S13: no), and then it outputs execution indications 123, 124, 125 and 126 in this order (S15 to S18). The execution indications 123 to 126 are realized in the form of function call in the simulation program. Therefore, the simulation is executed in the order from the completion processing module 20, via the execution module 18 and the decode module 16, to the fetch module 14, which means that one-cycle pipeline processing of the plurality of instructions is performed. Further, the scheduling module 23 outputs the response 102 making a notification that the pipeline processing for one cycle has been completed to the simulation control 34.

<Instruction Simulation Unit 30>

The instruction execution status condition unit 25 stores the copies of the fetch information 119 stored in the fetch information storage unit 15, the decode information 120, the execution information 121 and the completion information storage unit 21 respectively and the copies of the decode information 120, the execution information 121 and the completion information 122, and outputs the fetch information 119, the decode information 120, the execution information 121 and the completion information 122 to the pipeline condition display unit 24 as the present instruction execution status according to the simulation execution notification on an instruction-by-instruction basis or on a cycle-by-cycle basis from the simulation control unit 34.

The second register file module 31 stores the copy of the register data of the first register file module 11 made more than one cycle before (that is, before executing a group of instructions). The stored contents are used for reconstructing the register data before executing the respective instructions included in the group of instructions after executing the group of instructions.

The memory value save unit 32 saves and stores the memory values before storing the writing destination address of the memory instruction when the simulation of the store instruction is executed in the execution module 18.

The resource information change unit 33 reconstructs the resource status before executing the simulation of the stop instruction when receiving the notification of the stop instruction from the simulation control unit 34. One of the instructions contained in the last group of instructions that has been already simulated by the pipeline simulation unit 10 is to be specified as this stop instruction. The resource information change unit 33 reconstructs the resource (memory data or register data) status on condition that the notified stop instruction has not been simulated yet based on the after-simulation resource and the before-simulation resource of the group of instructions generated by the pipeline simulation unit 10. In other words, it reconstructs the resource status corresponding to the case where instructions immediately before the stop instruction are simulated. Here, the after-simulation resources of the group of instructions are stored in the first register file module 11 and the memory module 12. Also, before-simulation resources of the group of instructions are stored in the second register file module 31 and the memory value save unit 32.

More specifically, when the stop instruction is instruction X, the resource information change unit 33 reconstructs the before-simulation status of the instruction X, Y and Z of the group of instructions. When the stop instruction is instruction Y, the resource information change unit 33 reconstructs before-simulation status of the instruction Y and Z of the group of instructions, and when the stop instruction is instruction Z, it reconstructs before-simulation status of the instruction Z in the group of instructions. At the time of reconstruction, the resource information change unit 33 identifies the resource updated by the valid instruction in the instructions X, Y, Z and memory access instruction by referring to the execution information 121 shown in FIG. 14 and obtains before-simulation resources of the instructions X, Y, Z and memory access instruction respectively. The data that shows the status immediately before the stop instruction in the obtained data is output to the debugger 3a as the register data 133 or the memory contents 135.

The simulation control unit 34 performs the simulation control on an instruction-by-instruction basis or the simulation control on a cycle-by-cycle basis according to the simulation execution instruction. In the case of simulation execution on an instruction-by-instruction basis, the simulation control unit 34 stores a stop instruction pointer showing which stop instruction it is, controls the simulation execution on an instruction-by-instruction basis according to the simulation execution instruction 131 from the debugger 3a, and sends a stop instruction notification to the debugger 3a as the result. In other words, the simulation control unit 34 manages one of plurality of instructions that has been just simulated in simulating a group of instructions by the pipeline simulation unit 10 as a stop instruction, when receiving the simulation execution instruction 131 and any instruction that satisfies the break condition is included in the group of instructions that has just been simulated by the pipeline simulation unit 10, it updates the stop instruction pointer to the instruction that satisfies the break condition and outputs the stop instruction notification 132 to the debugger 3a and the resource information change unit 33. On the other hand, when no instruction that satisfies the break condition is included in the group of instructions that has just been simulated by the pipeline simulation unit 10, it outputs the simulation execution instruction 101 to the pipeline simulation unit 10 so that the simulation of the group of instructions can be advanced one more cycle. In this way, it keeps outputting the simulation execution instruction 101 until the instruction that satisfies the break condition comes to exist in the simulation result of the just-before group of instructions. Also, as a simulation on a cycle-by-cycle basis, the simulation control unit 34 sets the stop instruction the leading instruction (the instruction of the Slot X) of a group of instructions, and controls the debugger 3a to output the simulation result on a cycle-by-cycle basis in the pipeline simulation unit 10.

Figure 18:
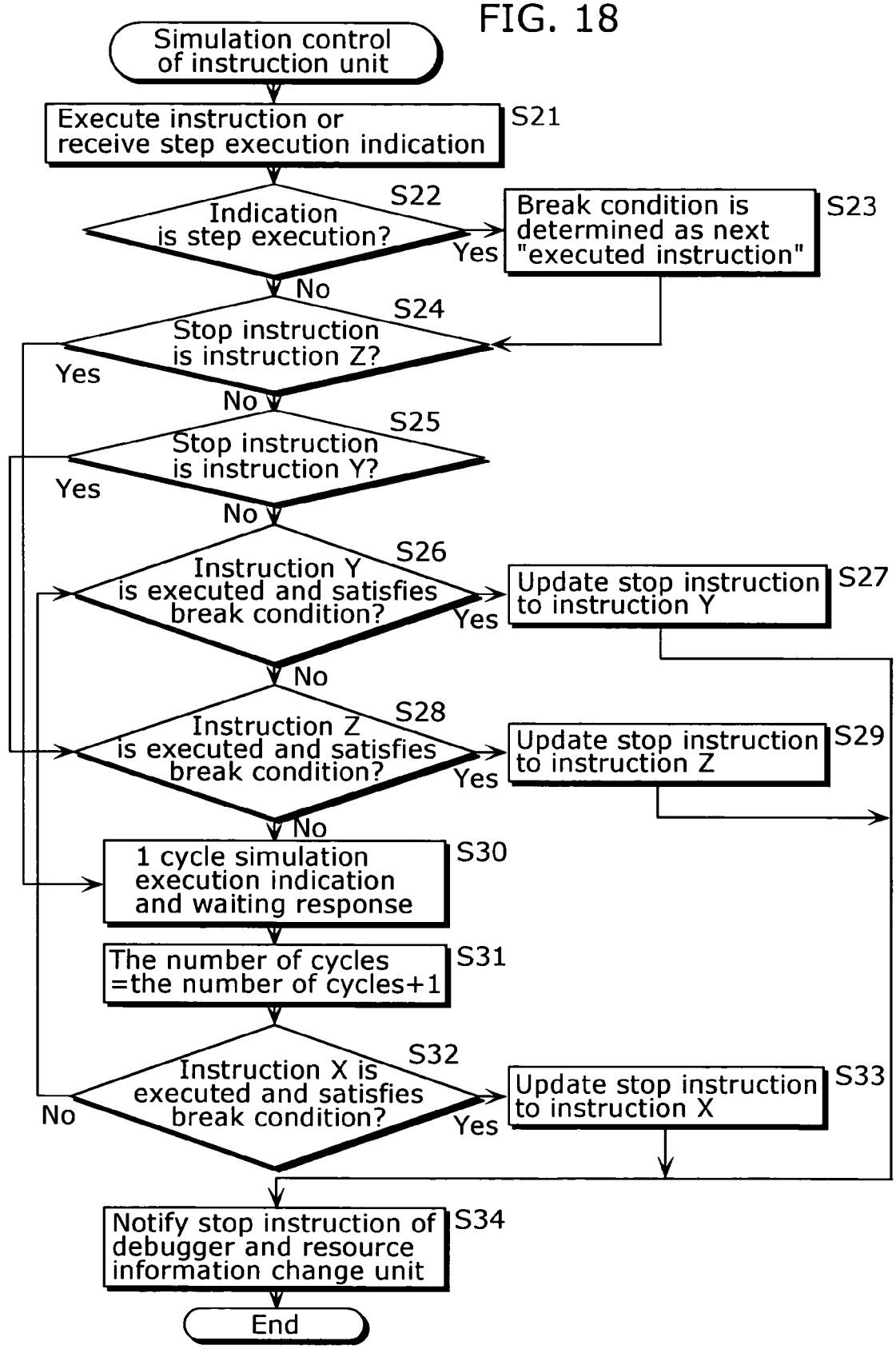
FIG. 18 is a flow chart showing the simulation processing performed on an instruction-by-instruction basis by a simulation control unit.

FIG. 18 is a flow chart showing the simulation control on an instruction-by-instruction basis by the simulation control unit 34.

In FIG. 18, the simulation control unit 34 sets the break condition as the following "executed instruction" (S23) when the instruction 131 is a step execute instruction (when any break condition is not specified) on receiving a break point specification, an execute instruction, a step execute specification instruction or the like as the simulation execution instruction 131 from the debugger 3a. Next, the simulation control unit 34 outputs the simulation execution instruction 101 to the scheduling module 23 when the present stop instruction is the instruction Z (S24: yes), waits for receiving the response 102 (S30) and increments the number of cycles by one after receiving the response. In this way, next group of instructions is simulated in the pipeline simulation unit 10. Also, this number of cycles is not the number of cycles in the simulation on an instruction-by-instruction basis but the number of cycles in the simulation for every group of instructions. In this way, the simulation control unit 34 correctly counts the number of cycles in the target processor.

Further, the simulation control unit 34 judges whether the instruction X in the newly simulated group of instructions has been already executed and satisfies the break condition or not (S32). As to the judgment whether the instruction x has been already executed or not, the simulation control unit 34 judges that it has been already executed when the valid flag of the instruction X in the execution information that is stored in the execution information storage unit 19 is "1" (valid) and the interlock flag stored in the common information storage unit 13 is "0" (not interlocked). This is because no valid instruction X is included in the group of instructions when the valid flag is "0" (invalid), and because the simulation of the group of instructions has not been completed yet even when the instruction X is included when as long as the interlock flag is "1" (interlocked). As to the judgment whether the instruction X and Z are executed or not is the same.

When the instruction X has been executed and satisfies the break condition as a result of the judgment in S32, it updates a stop instruction pointer to the instruction X (S33) and notifies the resource information change unit 33 and the debugger 3a of the updated stop instruction as the stop instruction notification 132 (S34). When the instruction X has not been executed yet or does not satisfy the break condition as a result of the judgment in S32, it proceeds to S26.

Also, the simulation control unit 34 judges whether the present stop instruction is the instruction Y (S25: yes), the instruction Z has been already executed and satisfies the break condition or not (S28). When the instruction Z has been already executed and satisfies the break condition as a result of the judgment in S28, it updates the stop instruction pointer to the instruction Z (S29) and notifies the resource information change unit 33 and the debugger 3a of the updated stop instruction as the stop instruction notification 132 (S34). When the instruction Z has not been executed yet or does not satisfy the break condition as a result of judgment in S28, it proceeds to S30.

Also, the simulation control unit 34 judges whether the instruction Y has been already executed and satisfies the break condition or not (S26) when the present stop instruction is the instruction X (it is judged not to be the instruction Y in S25). When the instruction Y has been already executed and satisfies the break condition as a result of the judgment in S26, it updates the stop instruction pointer to the instruction Y (S27) and notifies the resource information change unit 33 and the debugger 3a of the updated stop instruction as the stop instruction notification 132 (S34). When the instruction Y has not been executed yet or does not satisfy the break condition as a result of the judgment in S26, it proceeds to S38.

In this way, the simulation control unit 34 outputs the simulation execution instruction 101 for one cycle of a group of instructions to the pipeline simulation unit 10 until the instruction that satisfies the break condition is found in the simulation result of the group of instructions. Therefore, the status (resource) of the after-simulation group of instructions to which the stop instruction belongs and the status (resource) of the before-simulation group of instructions have been stored by the time the stop instruction is found. This makes it possible to reconstruct the status of the before-and-after simulation execution on an instruction-by-instruction basis.

Figure 19:
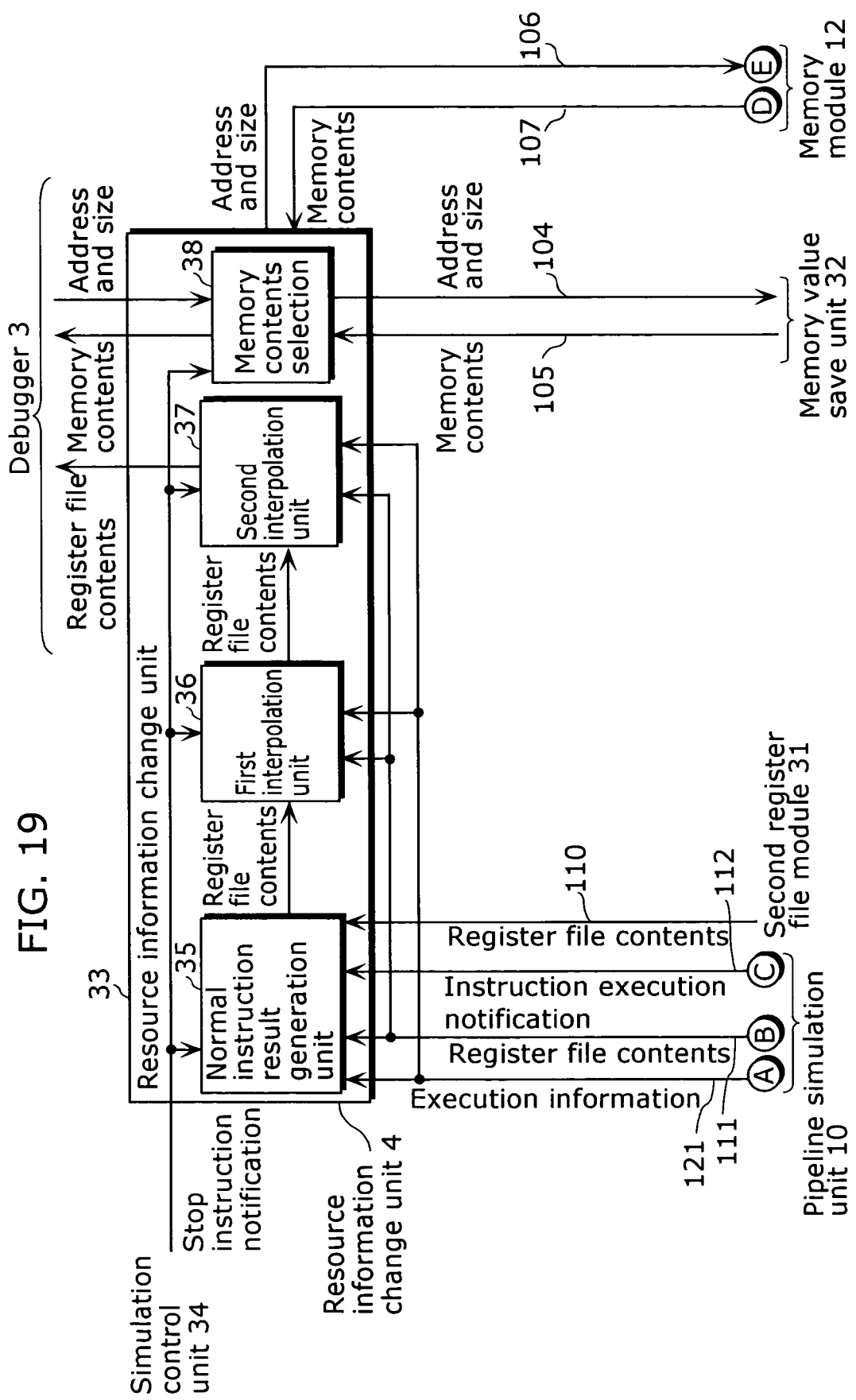
FIG. 19 is a block diagram showing the structure of a resource information change unit.

FIG. 19 is a block diagram showing the structure of the resource information change unit 33. The resource information change unit 33 comprises a normal instruction result generation unit 35, the first interpolation unit 36, the second interpolation unit 37 and the memory contents selection unit 38 and reconstructs the status before executing the simulation of the stop instruction to be notified by the simulation control unit 34.

The normal instruction result generation unit 35 reconstructs the register file 251 before executing the stop instruction based on the contents of the first register file module 11, the memory module 12, the second register file module 31 and the memory value save unit 32 when receiving the stop instruction notification 132 from the simulation control unit 34. The normal instruction result generation unit 35 reconstructs the register file 251 in both cases where the notified instruction is the normal instruction and where it is the delay instruction, in addition, the reconstruction is interpolated by the first interpolation unit 36 and the second interpolation unit 37 in the case where it is the delay instruction or in the case where there exists output dependency.

Figure 20:
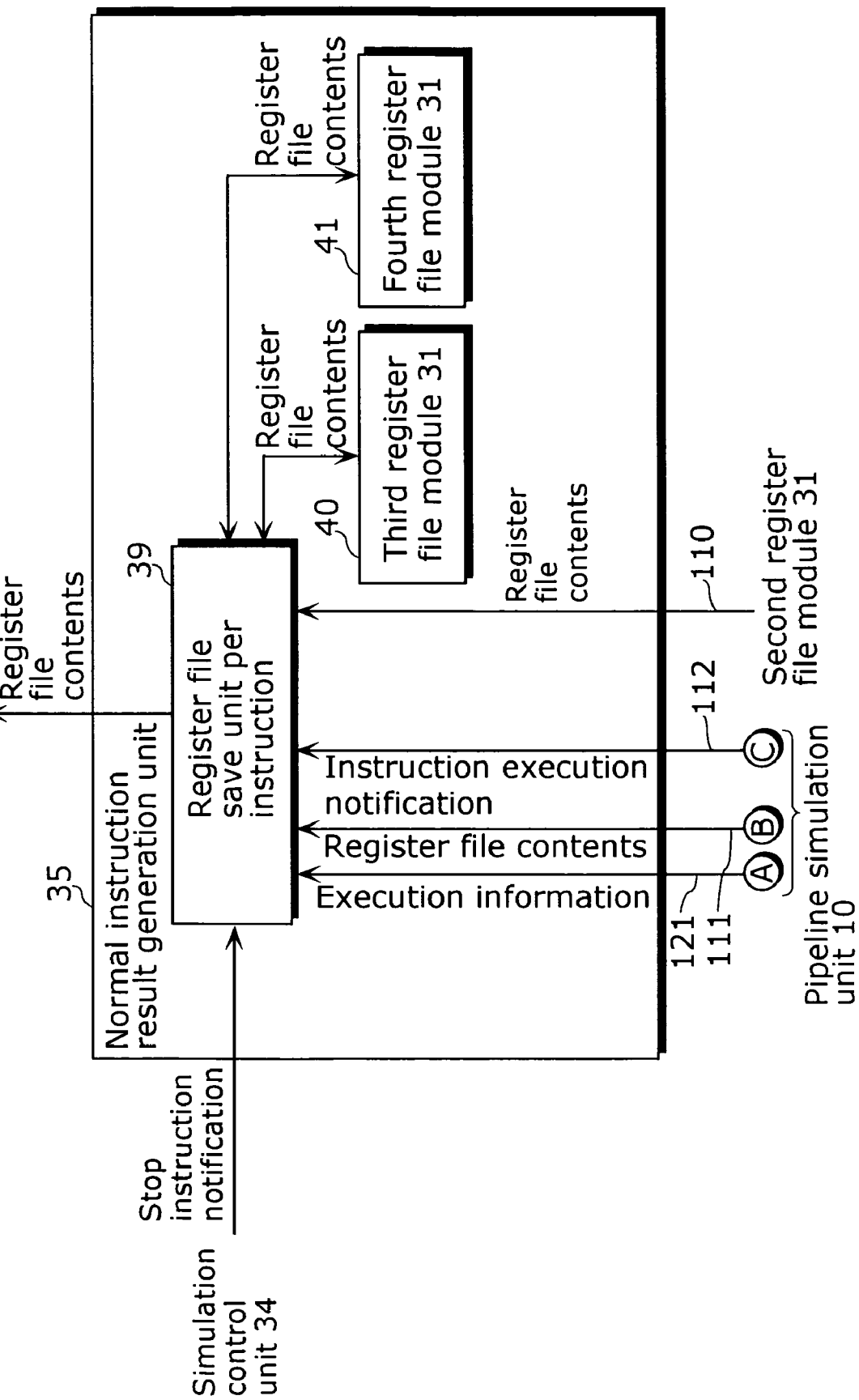
FIG. 20 is a block diagram showing the detailed structure of a normal instruction result generation unit.

A block diagram showing the detailed structure of the normal instruction result generation unit 35 is shown in FIG. 20. As shown in FIG. 20, the normal instruction result generation unit 35 comprises a register file save unit per instruction 39, the third register file module 40 for storing the simulation execution result of the instruction X and the fourth register file module 41 for storing the simulation execution result of the instruction Y.

The register file save unit per instruction 39 receives the instruction execution notification of the instruction X output from the execution module 18 and copies the contents of the first register file module 11 as the simulation execution result on condition that instruction X is executed to the third register file module 40, likewise, it receives the instruction execution notification of the instruction Y and copies the contents of the first register file 11 as the simulation execution result on condition that instructions up to instruction Y are executed to the fourth register file module 41. In this way, the register data on condition that instructions X, Y and Z are executed in order are to be stored in the third, the fourth and the first register file modules respectively. At this time, the second register file module 31 stores the execution result of the just-before group of instructions. Also, the register file save unit for each instruction 39 outputs the contents of the second register file module 31 showing the execution result of the just-before group of instructions when the stop instruction is instruction X at the time of receiving the stop instruction notification from the simulation control unit 34. Likewise, it outputs the contents of the third register file module 40 when the stop instruction is the instruction Y or outputs the contents of the fourth register file module 41 when the stop instruction is the instruction Z to the debugger 3a via the first interpolation unit 36 and the second interpolation unit 37. The contents that are output do not need to be interpolated by the first interpolation unit 36 and the second interpolation unit 37 when the instructions X to Z are the normal instructions (instructions that do not cause any delay) and they are output to the debugger 3a as they are.

In this way, the normal instruction result generation unit 35 generates the contents of the register file 251 when the instruction just before the stop instruction has just been executed irrespective of a stop instruction out of the instructions X, Y and Z when no delay instruction is included in the group of instructions. Also, the target processor has an architecture that does not accept any output dependency in the same group of instructions, the third register file module 40 and the fourth register file module 41 can be omitted. When omitting them, the normal instruction result generation unit 35 refers to the register update information in the execution information storage unit 19 so as to generate the contents to be output by reading out the register contents which is updated by the instructions X, Y and Z from the first register file module 11 and the other register's contents from the second register file module 12.

The first interpolation unit 36 refers to the register number updated by the delay instruction and the updated contents (memory access data) from the execution information storage unit 19 when any delay instruction (memory access instruction) is included in the EX stage of the group of instructions, and interpolates the contents of the register file 251 showing the status before executing the stop instruction generated by the normal instruction result generation unit 35.

For example, when the load instruction (ld R0, (R1+)) takes two cycles, the update of the register R1 and R0 must be completed in the first cycle and the second cycle respectively. This is because one of three ALU that requires one cycle handles the update of R1 and the memory access control unit 209 that requires two cycles handles the update of R0 in the target processor. Therefore, the execution information storage unit 19 stores the update register number of the memory access instruction and the updated contents as the memory data. The first interpolation unit 36 reads out the register update information of the memory access instruction from the execution information storage unit 19 and the memory access data whose contents to be updated when the stop instruction is the instruction after the load instruction of the same group of instructions and recognizes the register to be updated as the delay register and the memory access data as the delay data.

Further, the first interpolation unit 36 reconstructs the register file 251 on condition that there exists a delay instruction by updating the part corresponding to the delay register of the register file contents outputted from the normal instruction result generation unit 35 using the delay data. Note that no interpolation is performed when a register to be updated by the load instruction is updated by the later instruction of the same group of instructions (output dependency exists) because register writing by the load instruction is cancelled. As a matter of course, no interpolation is performed when the delay instruction is the instruction excluding the update of a register (such as a store instruction). In this way, the resources can be correctly reconstructed on an instruction-by-instruction basis when the simulation on an instruction-by-instruction basis is indicated.

The second interpolation unit 37 updates the delay register using the delay data like the first interpolation unit 36 and interpolates the register file contents output from the first interpolation unit 36 when a delay instruction is included prior to the stop instruction and an output dependency instruction is included after the stop instruction in the case where a delay instruction that requires two or more cycles in the MEM stage and the other instructions that are in output dependency with the delay instruction placed after the delay instruction (called an output dependency instruction from here) are indicated in the same group of instructions.

For example, the instruction Y is the load instruction (ld R1, (R2+)) and the instruction Z is the forward instruction (mov R1, 3), and the EX stage of the load instruction requires two cycles. In this case, both of the instructions Y and Z are in output dependency making the register R1 their destination, but the register R1 must be updated by the instruction Z. This is because the register R2 is incremented by the load instruction and the register R1 is updated by the move instruction in the first cycle of the EX stage in the target processor, and the update of the register R1 by the load instruction is cancelled by the instruction cancellation unit 220 in the second cycle. However, it is unnatural that the execution result of the instruction Y is cancelled by the instruction Z that has not been executed yet in the simulation on an instruction-by-instruction basis. It should be cancelled because the register R1 is overwritten by the instruction Z. Therefore, the second interpolation unit 37 interpolates the execution result even when the execution contents are to be cancelled because of output dependency because it generates the same result as the case where instructions Y and Z are executed one-by-one in order.

Figure 21:
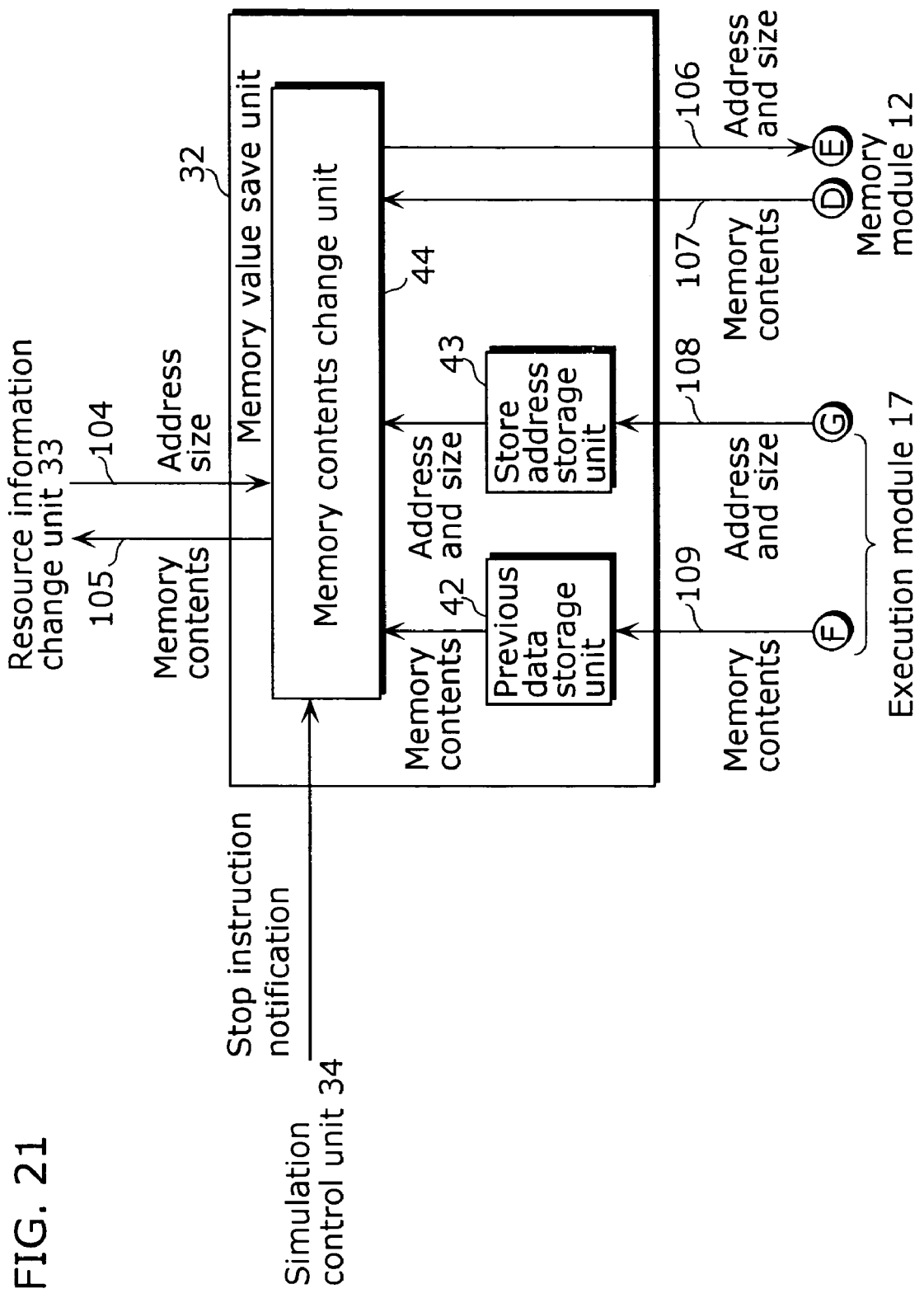
FIG. 21 is a block diagram showing the detailed structure of a memory value save unit.

FIG. 21 is a block diagram showing the detailed structure of the memory value save unit 32. Regarding FIG. 21, the memory value save unit 32 comprises a before-store data storage unit 42 for storing the memory data before being written by the store instruction, a store address storage unit 43 for storing the address specified by the store instruction and a memory contents change unit 44.

The memory contents change unit 44 reconstructs the memory contents before executing the store instruction when a store instruction is included after the stop instruction of the group of instructions when receiving a stop instruction notification from the resource information change unit 33. When the store destination address of the store instruction is contained in the memory address and the size 104 that is specified as the one to be read out from the resource information change unit 33, the data of the before-store data storage unit 42 is contained in the memory contents 105 instead of the data of the memory module 12 and output to the resource information change unit 33.

The simulation system 1 that is constructed in this way in the embodiment will be explained with reference to program examples.

<The First Program Example>

FIG. 22 is a diagram showing the first program example to be a simulation target. The program example of FIG. 22 shows only an instruction group 1 comprising the instructions 6 and 7 that are executed simultaneously and an instruction group 2 comprising an instruction 8. Each instruction describes a "PC" showing the instruction address, a "mnemonic", a "simulation result", a "display result" and a "stop". The status of the instruction group 1 just before the simulation is {R0, R1, R2, R3, F0}={1, 0, 0, 0, 1}.

The "simulation result" shows the status after simulating the instruction on an instruction-by-instruction basis by the instruction simulation unit 30 (only R0 to R3 and F0 are written in FIG. 22). The "display result" shows the status to be displayed in the debugger 3 when the instruction is the stop instruction and the status before executing the stop instruction. The "stop" shows whether the simulation breaks (stops) or not when setting the instruction as a break condition, that is, whether the instruction is the stop instruction or not.

In the case of this program example, the instructions 6 and 8 can be the stop instructions, but the instruction 7 cannot be the stop instruction. This is because the instruction 7 is nullified by the flag F0, and thus the simulation does not break even when the simulation setting the instruction 7 as the break condition is executed, and because at that time, the simulation system 1 judges the break condition after executing the simulation of the group of instructions instead of judging the detection of the stop instruction setting the break condition before executing the simulation of the instruction as the break condition. In this way, the same simulation result of the program execution pathway (that is, the program branch pathway) as the program execution pathway (that is, the program branch pathway) in the target processor is obtained.

To put it more specifically, in the simulation of the instruction group 1 in the pipeline simulation unit 10, the execution module 18 cancels the simulation of the instruction 7 as the flag F0 is reset because of the simulation by the instruction 6 and stores the execution information 122 which is made by resetting the valid flag of the instruction 7 in the execution information storage unit 19. The simulation control unit 34 does not judge whether the instruction 7 satisfies the break condition or not because it judges that no instruction has been executed yet (or no instruction is included) when the valid flag is "0" in the simulation result of the instruction group 1. Therefore, the instruction 7 cannot be the stop instruction.

In this way, the simulation system 1 can stop the simulation on an instruction-by-instruction basis instead of stopping the simulation for every group of instructions. In addition, when the target processor has a cancellation function, it correctly simulates the cancellation of the instructions in the group of instructions.

<The Second Program Example>

FIG. 23 is a diagram showing the second program example to be a simulation target. The program example in FIG. 23 shows the instruction group 1 comprising the instructions 1 to 3 to be executed simultaneously and the instruction group 2 comprising instructions 4 and 5. A "PC", a "mnemonic", a "display result", a "stop" of each instruction is the same as FIG. 22. Note that the status just before the simulation of the instruction group 1 is {R0, R1, R2, R3, R4, R5 and R6}={10, 5, 0, 0, 0, 1, 2}, mem (0)=100, mem (4)=200.

The instruction 3 of this program example is an instruction for reading out the memory data setting the contents of the register R4 as the address and loading it into the register R3 and incrementing the register R4 by four. The instruction 4 is an instruction for storing the data of the register R2 in the memory setting the contents of the register R4 as the address and incrementing the register R4 by four. These instructions 3 and 4 are in data dependency. In other words, as the instruction 4 uses the result of the register R4 being incremented by four by the instruction 3, the instruction 4 cannot be executed correctly until the instruction 3 is executed completely.

In this regard, the target processor prevents interlock from occurring by forwarding, as depicted in FIG. 10. In other words, the data of the register R4 incremented by four in the execution stage of the instruction 3 is supplied to the execution stage of the instruction 4 in the next cycle by the forwarding unit 253. One-cycle interlock occurs in FIG. 10 on the precondition that the execution stage of the load instruction takes two cycles, but this interlock does not stem from the data dependency but from the two-cycle execution stage. When the execution stage of the load instruction is only one cycle, no interlock occurs even in FIG. 10.

The simulation of the simulation system 1 corresponding to this will be explained in the following two cases: (1) the case where the load instruction of the instruction 3 completes in the first cycle; (2) the case where the load instruction of the instruction 3 requires two cycles.

<(1) The Case where the Instruction 3 (the Load Instruction) Completes in the First Cycle>

The execution module 18 stores the data of the register R4 of the first register file module 11 in the simulation of the execution stage of the instruction 3. Further, the execution module 18 simulates the instruction 4 using the register R4 of the first register file module 11 as the simulation of the execution stage of the instruction 4 in the next cycle. In this case, the simulation system 1 realizes the function corresponding to the forwarding of the target processor using the first register file module 11.

On the other hand, when setting the break condition or the instruction 4 by the step execution as the stop instruction, the simulation control unit 34 updates the stop instruction to the instruction X and notifies the debugger 3a and the resource information change unit 33 of the update as the instruction X matches the instruction 4 in the simulation result of the instruction group 2 in the pipeline simulation unit 10. The resource information change unit 33 reconstructs the status of the instruction X before executing the simulation and notifies the debugger 3a of the register data 133 and the memory contents 135. In this way, the simulation result of the instruction 3 just before the instruction X (instruction 4) becomes the one in the column of the display result of the instruction 4 in FIG. 23.

Also, when the debugger 3a refers to the mem (4) in this status, the resource information change unit 33 displays the value 200 saved in the memory value save unit 32 so as to display the mem (4) before executing the instruction 4 (store instruction).

<(2) The Case where the Execution Stage of the Instruction 3 (the Load Instruction) Requires Two Cycles>

Also in this case, the display result shown in FIG. 23 can be obtained like in (1), but this case differs from (1) in that two-cycle simulation is performed in the simulation system 1. This is because the number of cycles of the target processor is simulated correctly.

More specifically, the instruction 3 is set as the "memory access instruction" for reading out the memory data and stores it in the R3 setting the "instruction Z" that instructs the increment of the register R4 by four in the decode information 120 in the decode information storage unit 17 and R4 as the address. The execution module 18 updates the register R4 of the first register file module 11 as the simulation of the "instruction Z" (especially the part for incrementing the register R4 by four) in the simulation in the first cycle of the execution stage of the instruction 3 and sets an interlock flag. It simulates the "memory access instruction" in the second cycle.

Further, in the cycle next to the first cycle of the instruction 3, the simulation result of the instruction Z (the register R4 which is made by updating the first register file module 11) becomes available by the instruction 4. This functions like the forwarding.

On the other hand, when setting the break condition or the instruction 4 by the step execution as the stop instruction, the simulation control unit 34 reconstructs the status before executing the instruction X like (1) and notifies the debugger 3a of the register data 133 and the memory contents 135 according to the flow shown in FIG. 18.

The above-mentioned (1) and (2) reach the same result because the stop instruction on an instruction-by-instruction basis is determined by the simulation control unit 34 and, when the stop instruction determined by the resource information change unit 33 has not been executed yet, the status where the instruction just before the stop instruction is reconstructed. Also, as the simulation of the group of instructions is performed on a cycle-by-cycle basis in the pipeline simulation unit 10, the number of cycles, which is required for the target processor, to be counted by the simulation control unit 34 can be correctly counted in both the cases of (1) and (2) respectively.

Also, the simulation control unit 34 can count the number of cycles correctly like in (1) when the execution stage of the instruction 4 (store instruction) in FIG. 23 is one cycle and like in (2) in the case of two cycles.

<The Third Program Example>

FIG. 24 is a diagram showing the third program example to be a simulation target on condition that the delay instruction is in output dependency. In the program example of FIG. 24, in addition to the instructions 12 to 14 which belong to the instruction group 5, the contents of the first register file module 11 after the instruction group 5 is simulated by the pipeline simulation unit 10, the second register file module 31, the third register file module 40 and the fourth register file module 41 (only R0 to R2 in FIG. 24) and the contents of the memory access data in the execution information storage unit 19 are described.

In this program example, the instruction 13 is the delay instruction and the instruction 13 and the instruction 14 are in output dependency. The status of the instruction group 5 just before the simulation is {R0, R1, R2}={0, 0, 0} mem (0)=200. Also, the memory access of the instruction 13 requires two cycles.

The pipeline simulation unit 10 and the simulation control unit 34 simulate the two-cycle execution stage by the delay instruction like the second program example (2). The resource information change unit 33 generates the result giving a software developer the illusion that the instructions 13 and 14 that are in output dependency are executed in sequential order. In other words, the resource information change unit 33 generates the simulation result of the instruction just before the instruction 13 like shown in the column of "display result" of the instruction 14 in FIG. 24.

In this regard, the target processor cancels the update of the register R1 by the instruction 13 and executes the update of the register R1 by the instruction 14 only. The purpose is to obtain the result from executing instructions 12 and 13 in sequential order.

On the other hand, the resource information change unit 33 generates the simulation result of the instruction 13 when the instruction that follows the instruction 13 (instruction 14) is the stop instruction or generates the simulation result of the instruction 14 when the instruction that follows the instruction 14 is the stop instruction. The resource information change unit 33 is the same as the target processor in the respect that it obtains the result from executing the instructions 12 and 13 in sequential order, but it differs in that it also generates the simulation result of the instruction 13 to be cancelled. It provides a user of the debugger 3a with good usability in that it indicates the process where instructions which are in data dependency are to be cancelled.

More specifically, the pipeline simulation unit 10 updates the first and the second register file modules 11 and 31 by the simulation of the instruction group 5. At this time, the register file save unit for each instruction 39 also updates the third and the fourth register file modules 40 and 41 on receiving the instruction execution notification from the execution module 18.

As a result, the first register file module 11 stores the data just after the simulation of the instruction group 5. This is data just after the simulation of the instruction Z (that is, the instruction 14). The second register file module 31 stores the data just before the simulation of the instruction group 5. The third register file module 40 store the data after the simulation of the instruction X (that is, instruction 12), and the fourth register file module 41 stores the data after the simulation of the instruction Y (that is, the instruction 13). The memory access data in the execution information storage unit 19 stores the contents of the memory that is loaded in the instruction 13.

When the instruction 14 is indicated as the stop instruction, the resource information change unit 33 outputs, to the debugger 3a, the data made of the interpolated memory access data by the second interpolation unit 37 as the register data 133 in comparison with the data of the fourth register file module 41.

In this way, the simulation system 1 makes it possible to obtain the simulation result on an instruction-by-instruction basis from executing those instructions in sequential order when the delay instruction and the other instruction are in output dependency, furthermore, it makes it possible to count the number of cycles for every group of instructions correctly.

<Command and Display Operations>

FIG. 26 shows an example of commands which is input in the command input window W3 as a user operation that specifies the simulation of a group of instructions on a cycle-by-cycle basis. In FIG. 26, "set stepmode, cycle" is a command that sets the step execution mode to the simulation on a cycle-by-cycle basis (cycle step mode), not on an instruction-by-instruction basis. This command is input in the simulation control unit 34 from the user interface 4 via the debugger 3a. The simulation control unit 34 performs the simulation on a cycle-by-cycle basis as the default of the step execution mode from this command and outputs the simulation result to the debugger 3a.

FIG. 27 shows an example of commands which are input in the command input window W3 as a user operation that specifies the simulation of a group of instructions on an instruction-by-instruction basis. In FIG. 27, "set stepmode, inst" is a command that sets the step execution mode to the simulation on an instruction-by-instruction basis (instruction step mode). This command is input from the user interface 4 to the simulation control unit 34 via the debugger 3a. The simulation control unit 34 performs the simulation on an instruction-by-instruction basis as the default of the step execution mode from this command and outputs the simulation result to the debugger 3a. A user can selectively switch to the simulation on an instruction-by-instruction basis, or to the simulation for every group of instructions, that is, to the simulation for every cycle of a group of instructions.

Display examples to be displayed according to the above-mentioned command input by a user will be explained below with reference to FIG. 28 to FIG. 33.

Figure 28:
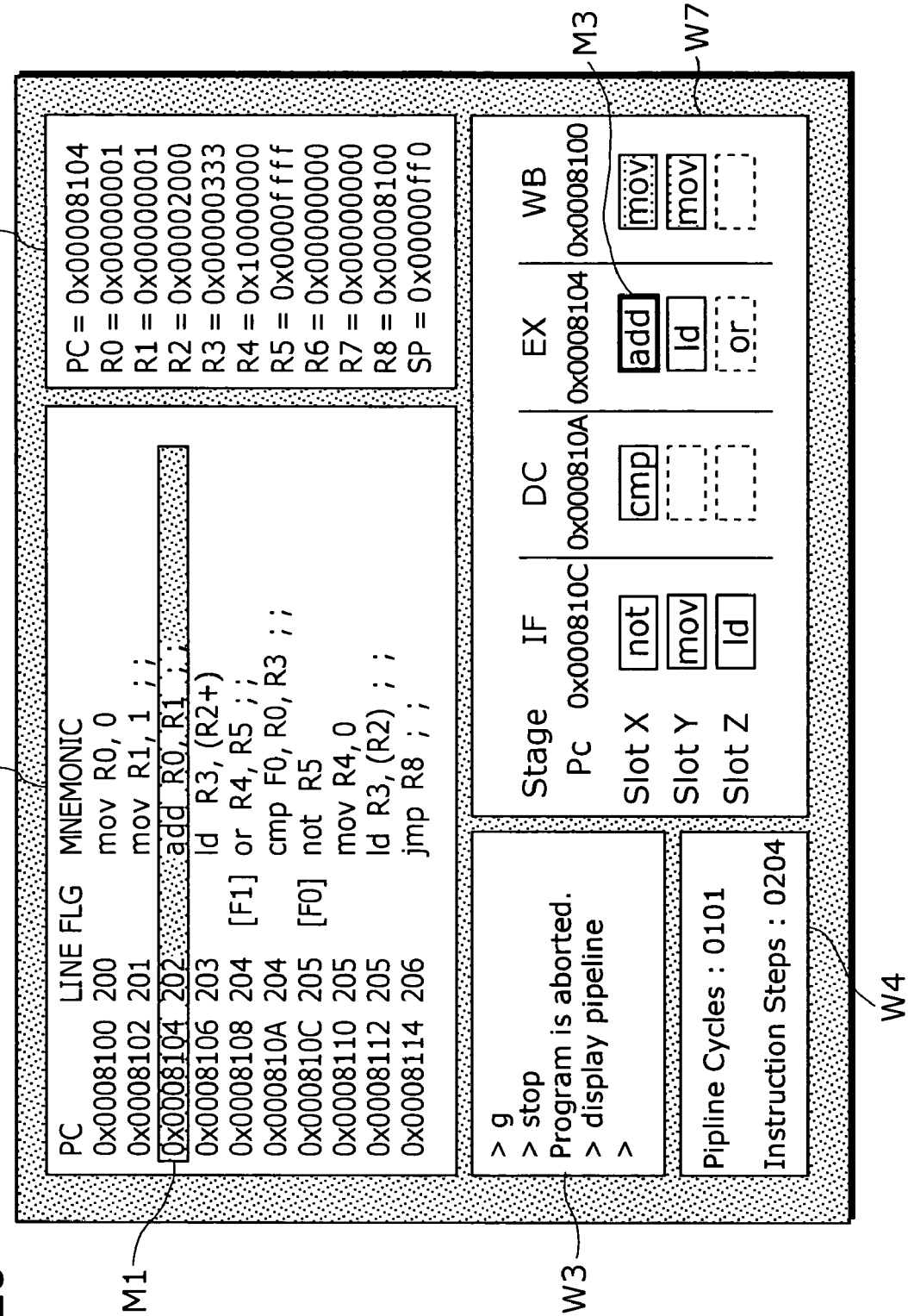
FIG. 28 is a diagram showing the display example of the pipeline status.

FIG. 28 is a diagram showing the display example of the pipeline status. In the command input window W3 in FIG. 28, the command "display pipeline" is a command that indicates that the display of the pipeline status window W7 is displayed. This command is input in the simulation control unit 34 from the user interface 4 via the debugger 3a. The simulation control unit 34 outputs the simulation execution notification on an instruction-by-instruction basis or on a cycle-by-cycle basis to the instruction execution status storage unit using this command. The instruction execution status storage unit 25 outputs the storage contents (fetch information, decode information, execution information and completion information) to the pipeline status display unit 24 according to the simulation execution notification. The pipeline status display unit 24 generates the display image that shows the instruction execution status in the pipeline like shown in the pipeline status window W7 in FIG. 28 according to the fetch information, the decode information, the execution information and the completion information.

In the display example of the pipeline status window W7 in FIG. 28, respective instructions of the PC, the slots X, Y and Z and those statuses are shown for respective stages of IF, DC, EX and WB. The PC shows the instruction address of the slot X out of slots X, Y and Z as a representative. Instructions for every stage or slot are displayed in mnemonic and the status is also shown using ornamental writing such as a solid line frame, a broken line frame, a wide line frame, hatching, separation by color and the like.

In FIG. 28, the solid line frame shows a valid instruction. The broken line shows an invalid instruction or absence of any instruction. For example, a single valid instruction (cmp instruction) is included in the slot X of the DC stage, but no instruction is included in the slots Y and Z. Two valid instructions (an add instruction and a ld instruction) are included in the slots X and Y of the EX stage, and a cancelled instruction (such as a conditional execute instruction) is included in the slot Z. The reason why a cmp instruction is solely included in the slot X in the DC stage is that the "not" instruction that follows the cmp instruction is a conditional execute instruction setting the comparison result as the execution condition. In other words, the cmp instruction and the not instruction are in data dependency.

Highlight by using a wide line frame shows the stop instruction mark M3 showing the stop instruction (the add instruction in FIG. 28). Hatching shows that the instruction has been already executed. In FIG. 28, finishing the execution of the EX stage means finishing the execution of the instruction.

Figure 29:
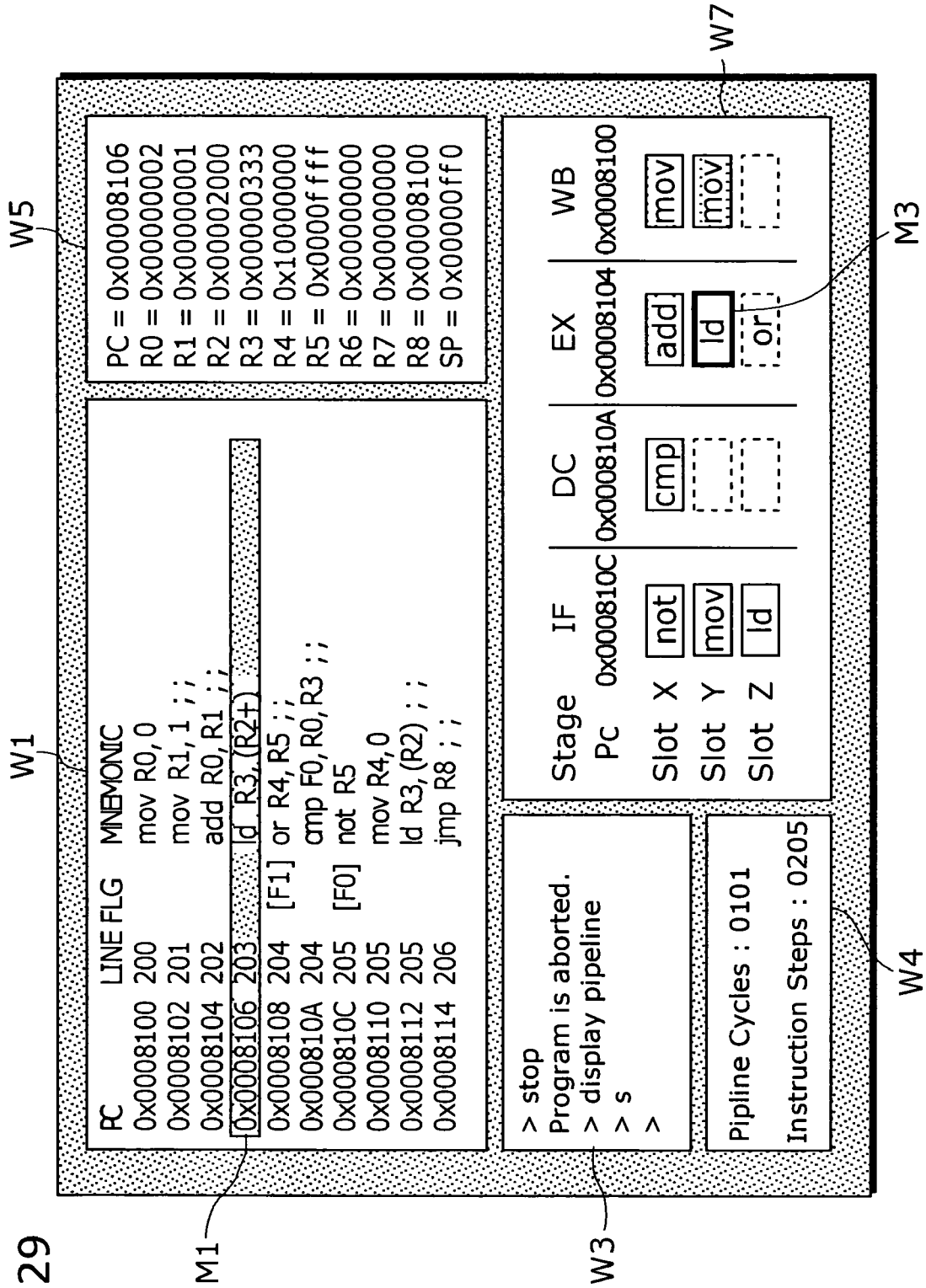
FIG. 29 is another diagram showing the display example of the pipeline status.

FIG. 29 is a diagram showing the display example on condition that a single instruction is further executed step-by-step by simulating on an instruction-by-instruction basis under the pipeline execution status in FIG. 28. In the command input window W1 in FIG. 29, command "s" is a command indicating the step execution. It is assumed that the instruction step mode is set in FIG. 29.

The simulation control unit 34 simulates a single instruction performing the simulation on an instruction-by-instruction basis using this step execution command. By doing so, hatching that shows "already executed" is added to the add instruction like in the pipeline status window W7 in FIG. 29, and the stop instruction mark M3 shifts to the ld instruction that follows the add instruction.

Figure 30:
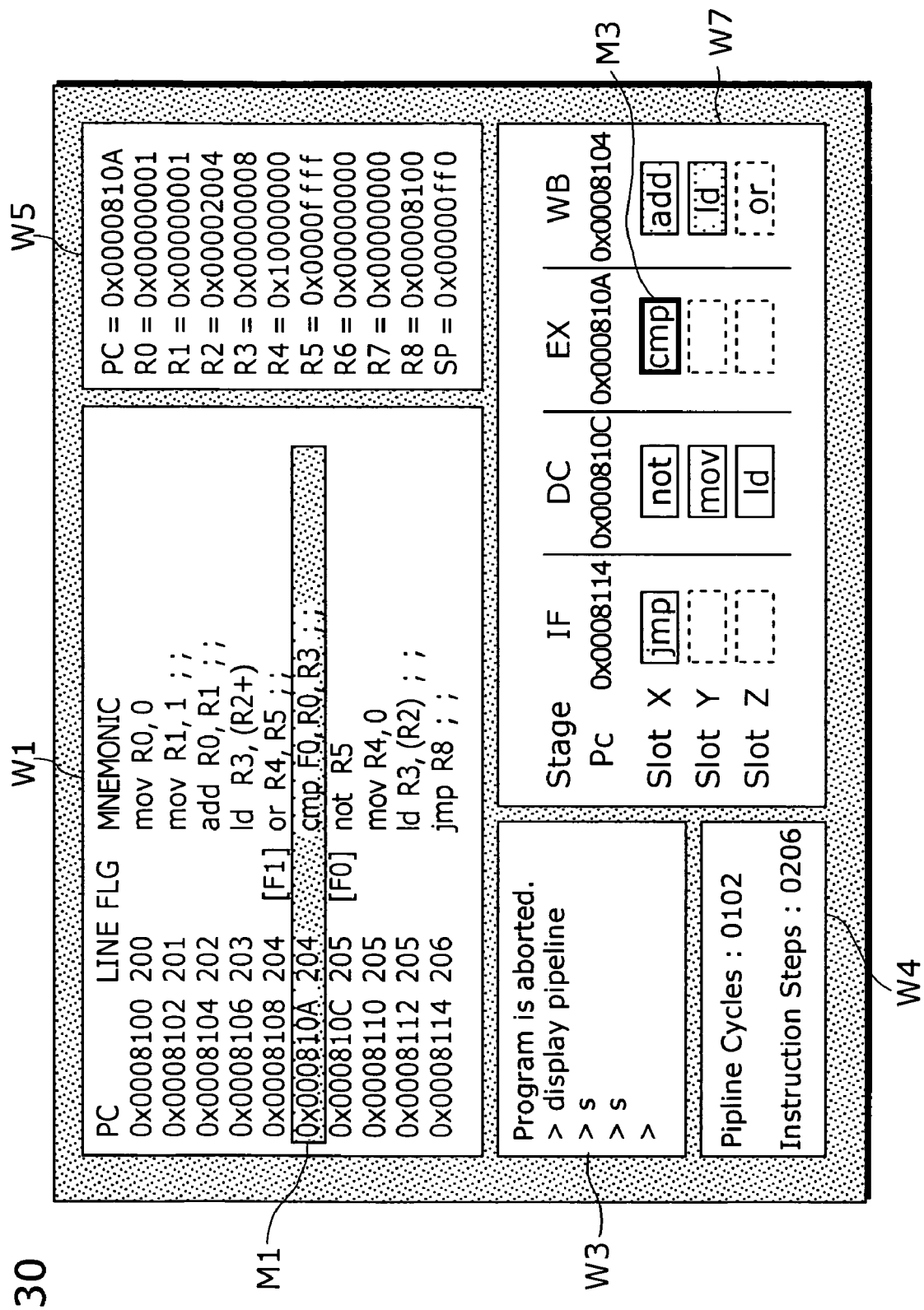
FIG. 30 is another diagram showing the display example of the pipeline status.

FIG. 30 is a diagram showing the display example on condition that a single instruction is executed step-by-step by simulating on an instruction-by-instruction basis according to "s" command under the pipeline execution status in FIG. 29.

The simulation control unit 34 simulates a single instruction performing the simulation on an instruction-by-instruction basis using this step execution command. By doing so, the ld instruction with the stop instruction mark M3 is simulated in FIG. 29 and the next instruction becomes a stop instruction. As the next "or" instruction is a cancelled instruction as shown by a broken line in this case, the valid instruction (a cmp instruction here) next to the ld instruction becomes a stop instruction. As a result, the stop instruction mark M3 shifts to the valid cmp instruction after the ld instruction like in the pipeline status window W7 in FIG. 30. Also, no instruction is included in the slots Y and Z because the jmp instruction in the slot X in the IF stage needs to be solely executed.

Figure 31:
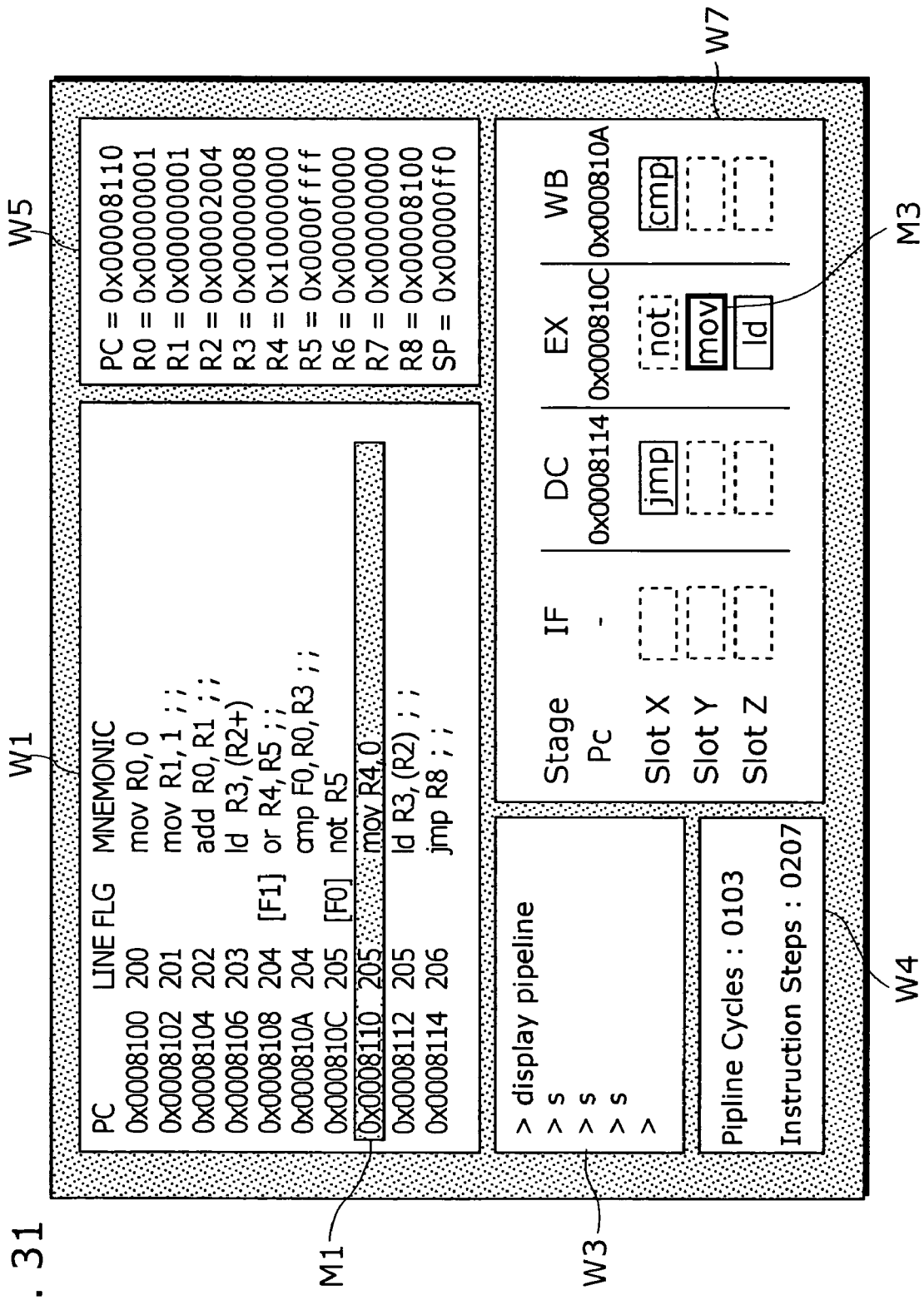
FIG. 31 is another diagram showing the display example of the pipeline status.

FIG. 31 is a diagram showing a display example on condition that a single instruction is executed step-by-step by simulating on an instruction-by-instruction basis according to the "s" command under the pipeline execution status in FIG. 30.

The simulation control unit 34 simulates a single instruction performing the simulation on an instruction-by-instruction basis by this step execution command. By doing so, the cmp instruction with the stop instruction mark M3 is simulated in FIG. 29, and a next instruction becomes a stop instruction. In this case, next a not instruction with a conditional execution is cancelled because of the simulation result of the cmp instruction. As a result, the valid instruction (mov instruction) next to the cmp instruction becomes the stop instruction. The stop instruction mark M3 shifts to the valid mov instruction next to the cmp instruction like in the pipeline status window W7 in FIG. 31. Also, the reason why no instruction is included in the respective slots of the IF stage is that the pipeline is flushed by the decode result of the jmp instruction of the DC stage. In this way, in the simulation on an instruction-by-instruction basis, the pipeline status on an instruction-by-instruction basis is shown in the pipeline status window W7 correctly.

Figure 32:
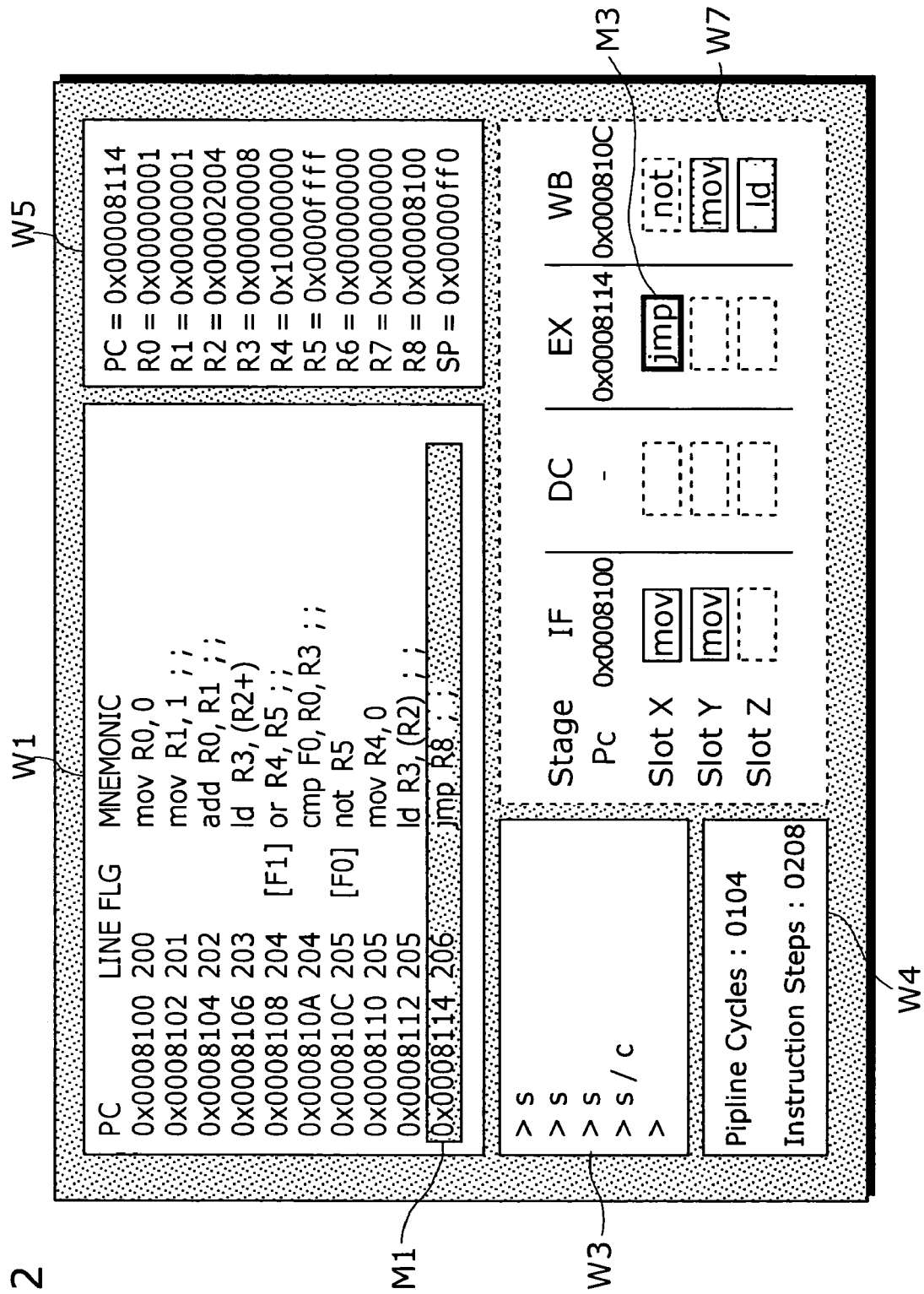
FIG. 32 is another diagram showing the display example of the pipeline status.

FIG. 32 is a diagram showing a display example on condition that a single cycle is executed step-by-step by simulating on a cycle-by-cycle basis, not on an instruction-by-instruction basis according to the "s/c" command. The "s/c" command in the command input window W1 of FIG. 32 is a step execution command to which an option parameter "/c" indicating the step execution on a cycle-by-cycle basis is added. The pipeline status window W7 shows the status of the next cycle in the simulation for every group of instructions using this command. As a result, like FIG. 32, the stop instruction mark M3 shifts to the first valid instruction (a jmp instruction) of the group of instructions next to the stop instruction (a mov instruction) of FIG. 31 like in FIG. 32. No instruction is included in the respective slots of the DC stage. In the IF stage, jmp destination instructions (two mov instructions) by the jmp instructions are fetched.

Figure 33:
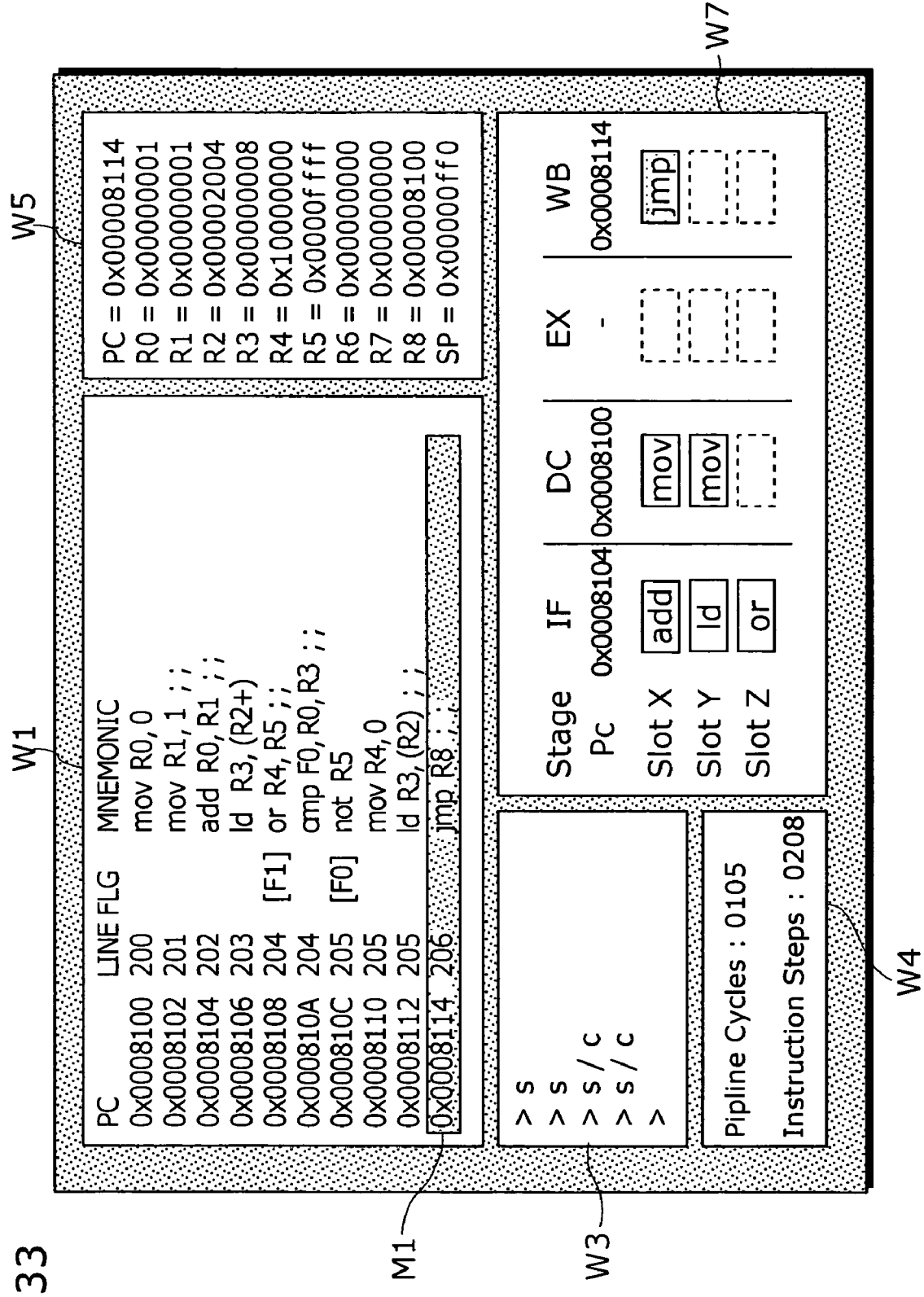
FIG. 33 is another diagram showing the display example of the pipeline status.

FIG. 33 is a diagram showing a display example on condition that a single cycle is further executed step-by-step by simulating on a cycle-by-cycle basis, not on an instruction-by-instruction basis according to the "s/c" command under the pipeline execution status in FIG. 32. In FIG. 32, as no instruction is included in the respective slots of the DC stage, no instruction is included in the respective slots of the EX stage as a result of the simulation on a cycle-by-cycle basis like in FIG. 33. In the simulation on a cycle-by-cycle basis like this, the pipeline statuses on a cycle-by-cycle basis are displayed in the pipeline status window W7 correctly.

As explained up to this point, the simulation system 1 in the embodiment of the present invention makes it possible to execute the simulation on an instruction-by-instruction basis while it is intended for a processor that executes a plurality of instructions simultaneously. Therefore, it can break for every unit of several instructions that are executed simultaneously, not for every group of instructions.

In addition, the simulation system 1 can simulate the number of cycles of the target processor correctly because it executes a two-step simulation that comprises the simulation for every cycle of the group of instructions and the simulation on an instruction-by-instruction basis.

Also, it simulates the number of cycles of the target processor correctly even when the target processor has a forwarding function, when interlock occurs according to a delay instruction and when it has a cancellation function.

Note that the simulation control unit 34 can be constructed in a way that it judges the break condition before the simulation instead of judging whether the instruction satisfies the break condition or not after simulating the instructions on an instruction-by-instruction basis in the above-mentioned embodiment. In this case, the simulation result and the display result to the first program example of FIG. 22 are shown in FIG. 25. It differs from FIG. 22 only in the column of "display result". In other words, the column of "display result" of FIG. 25 shows the simulation result of the instruction like in the column of "simulation result". In FIG. 25, it stops when the instruction 7 to be cancelled is made to be the break condition. In this case, a software developer can check whether the instruction 7 is cancelled or not.

Also, as to the number of required cycles of the MEM stage of the memory access instruction in the above-mentioned embodiment, the number of cycles in the target processor can be simulated correctly by applying the simulation apparatus of the present invention even when the number of cycles is one or any other integer more than one, or when it dynamically changes. In this case, it should be constructed in a way that it simulates at which cycle a response to the memory access (ACK) in the memory module is made.

The third register file module 40 may store only the data of registers to be updated according to an instruction instead of storing all the register data. The case of the fourth register file module 41 is similar.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A simulation apparatus for simulating a very long instruction word processor, said simulation apparatus comprising:
a first simulation unit configured to simulate execution of a group of instructions on a cycle-by-cycle basis, said group of instructions comprising instructions in the same stage of pipeline processing and said instructions being intended to be simultaneously executed and being simulated successively, and to generate a first simulation result; and
a second simulation unit configured to simulate, based on the first simulation result generated by said first simulation unit, a sequential execution of said group of instructions on an instruction-by-instruction basis and to generate a second simulation result.

2. The simulation apparatus according to claim 1, wherein said second simulation unit is configured to generate the second simulation result by undoing the simulation of the execution of one of the instructions from said group of instructions previously simulated by said first simulation unit.

3. The simulation apparatus according to claim 2 further comprising a display control unit configured to control a display unit to display the second simulation result generated by said second simulation unit.

4. The simulation apparatus according to claim 2, wherein said second simulation unit includes:
a judgment unit configured to judge whether or not an instruction that satisfies a break condition is included in the execution of said group of instructions previously simulated by said first simulation unit;
an indication unit configured to direct said first simulation unit to simulate execution of a next group of instructions when said judgment unit judges that no instruction satisfying the break condition is included in the execution of said group of instructions previously simulated by said first simulation unit;
a determination unit configured to determine that an instruction of said group of instructions is a stop instruction when said judgment unit judges that the instruction satisfying the break condition is included; and
a generation unit configured to generate a simulation result by undoing simulations of the execution of the stop instruction and subsequent instructions in the execution of said group of instructions previously simulated.

5. The simulation apparatus according to claim 1, wherein said first simulation unit is configured to simulate a pipeline processor that simultaneously executes a plurality of instructions, and
said simulation apparatus further comprises a display image generation unit configured to generate a display image showing instructions included in a pipeline based on the first simulation results generated by said first simulation unit and the second simulation results generated by said second simulation unit.

6. The simulation apparatus according to claim 5, wherein the display image contains a representation of an instruction included in every stage of the pipeline.

7. The simulation apparatus according to claim 1, wherein said first simulation unit is configured to simulate, on a cycle-by-cycle basis, a pipeline processor that simultaneously executes a plurality of instructions, said simulation apparatus further comprises:
an acception unit configured to accept a user instruction for indicating a step to be executed on the instruction-by-instruction basis and for indicating a step to be executed on the cycle-by-cycle basis; and
a display image generation unit configured to generate a display image showing the second simulation result generated by said second simulation unit when the user instruction that indicates the step to be executed on the instruction-by-instruction basis is accepted by said acception unit, and to generate a display image showing a simulation result generated on the cycle-by-cycle basis by said first simulation unit when the user instruction that indicates the step to be executed on the cycle-by-cycle basis is accepted by said acception unit.

8. The simulation apparatus according to claim 7, wherein the display image contains a representation of each instruction included in the pipeline.

9. The simulation apparatus according to claim 7, wherein the display image contains a representation of each instruction included in every stage of the pipeline.

10. The simulation apparatus according to claim 1, wherein said first simulation unit includes:
a hold unit configured to hold first data indicating resources of the very long instruction word processor;
a storage unit configured to store a copy of the first data in a memory unit as second data; and
a first simulator configured to update the first data by simulating an execution of a single group of instructions after said storage unit stores the copy of the first data,
wherein said second simulation unit is configured to obtain the second simulation results of the execution of said group of instructions on the instruction-by-instruction basis based on the first data and the second data.

11. The simulation apparatus according to claim 10, wherein said storage unit is configured to store register data in the memory unit as the second data, and said second simulation unit is configured to reconstruct data indicating a resource of the very long instruction word processor before executing the simulation of said group of instructions on the instruction-by-instruction basis.

12. The simulation apparatus according to claim 11, wherein said storage unit is configured to store memory data before memory writing, in said hold unit, and to store the memory data so that the memory data is contained in the second data when a memory write instruction is included in said group of instructions.

13. The simulation apparatus according to claim 10, wherein said second simulation unit further comprises:

a judgment unit configured to judge whether or not an instruction that satisfies a break condition is included in the execution of said group of instructions previously simulated by said first simulation unit;

an indication unit configured to direct said first simulation unit to simulate execution of a next group of instructions when said judgment unit judges that no instruction satisfying the break condition is included in the execution of said group of instructions previously simulated by said first simulation unit; and a determination unit configured to determine that an instruction is a stop instruction when said judgment unit judges that the instruction satisfying the break condition is included.

14. The simulation apparatus according to claim 13, wherein said determination unit is configured to determine that an instruction next to a present stop instruction is a break condition in a step of execution of a simulation performed on an instruction-by-instruction basis.

15. The simulation apparatus according to claim 13, wherein said second simulation unit further comprises a reconstruction unit configured to reconstruct, based on the first data and the second data, data indicating the resources of the very long instruction word processor, on a condition that execution of previous instructions, up to an instruction just prior to the stop instruction determined by said determination unit, has been simulated.

16. The simulation apparatus according to claim 13, wherein said second simulation unit further comprises a reconstruction unit configured to reconstruct, based on the first data and the second data, data indicating the resources of the very long instruction word processor, on a condition that execution of previous instructions, up to the stop instruction determined by said determination unit, has been simulated.

17. The simulation apparatus according to claim 16, wherein said first simulator is configured to generate update information indicating resources of the very long instruction word processor to be changed by each instruction of said group of instructions, and said reconstruction unit is configured to reconstruct the data from the resources of the very long instruction word processor that correspond to a result of a sequential execution of the instructions of said group of instructions according to the first data, the second data, and the update information.

18. The simulation apparatus according to claim 10, wherein said first simulator is configured to simulate an execution of the group of instructions on a cycle-by-cycle basis of pipeline processing, and the simulation apparatus is configured to count a quantity of execution cycles in the simulation for every group of instructions.

19. The simulation apparatus according to claim 18, wherein the very long instruction word processor to be simulated includes a cancellation unit configured to cancel an execution of an instruction within a plurality of instructions to be simultaneously executed, and said first simulator is configured to simulate said cancellation unit.

20. The simulation apparatus according to claim 18, wherein said first simulator is configured to simulate a delay cycle according to a delay instruction that causes a delay cycle in an execution stage of the very long instruction word processor to be simulated, and said reconstruction unit is configured to reconstruct data indicating the resources of the very long instruction word processor that correspond to a simulation result from simulating the delay cycle according to update information for the delay instruction.

21. The simulation apparatus according to claim 20, wherein said reconstruction unit is configured to generate data indicating the resources of the very long instruction word processor that correspond to a simulation result of simulating an output dependency instruction according to the update information for the delay instruction and according to the update information for the output dependency instruction that has an output dependency in the same group of instructions as the delay instruction.

22. A simulation method for simulating a very long instruction word processor, said simulation method comprising:

performing a first simulation comprising simulating execution of a group of instructions on a cycle-by-cycle basis, said group of instructions comprising instructions in the same stage of pipeline processing and said instructions being intended to be simultaneously executed and being simulated successively, and generating a first simulation result of said first simulation; and performing a second simulation comprising simulating, based on the first simulation result, a sequential execution of said group of instructions on an instruction-by-instruction basis and generating a second simulation result of said second simulation.

23. A computer-readable recording medium which stores a program for executing on a computer a simulation of a very long instruction word processor, the program causing the computer to execute a method comprising:

performing a first simulation comprising simulating execution of a group of instructions on a cycle-by-cycle basis, said group of instructions comprising instructions in the same stage of pipeline processing and said instructions being intended to be simultaneously executed and being simulated successively, and generating a first simulation result of said first simulation; and performing a second simulation comprising simulating, based on the first simulation result, a sequential execution of said group of instructions on an instruction-by-instruction basis and generating a second simulation result of said second simulation.

* * * * *